(12) United States Patent
Masuoka et al.

(10) Patent No.: US 9,117,528 B2
(45) Date of Patent: Aug. 25, 2015

(54) SEMICONDUCTOR DEVICE

(71) Applicant: UNISANTIS ELECTRONICS SINGAPORE PTE. LTD., Singapore (SG)

(72) Inventors: Fujio Masuoka, Tokyo (JP); Masamichi Asano, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/598,408

(22) Filed: Jan. 16, 2015

(65) Prior Publication Data

US 2015/0206588 A1    Jul. 23, 2015

(30) Foreign Application Priority Data

Jan. 20, 2014   (JP) ................................. 2014-008002

(51) Int. Cl.

| | |
|---|---|
| *H01L 27/01* | (2006.01) |
| *H01L 27/12* | (2006.01) |
| *G11C 16/08* | (2006.01) |
| *H01L 27/115* | (2006.01) |
| *H01L 29/78* | (2006.01) |

(Continued)

(52) U.S. Cl.
CPC .......... *G11C 16/08* (2013.01); *H01L 27/11526* (2013.01); *H01L 27/11573* (2013.01); *H01L 29/16* (2013.01); *H01L 29/456* (2013.01); *H01L 29/7827* (2013.01)

(58) Field of Classification Search
CPC ........................... H01L 27/1211; H01L 21/845
USPC ............................................ 257/350; 438/152
See application file for complete search history.

(56) References Cited

U.S. PATENT DOCUMENTS

| | | |
|---|---|---|
| 8,039,893 B2 | 10/2011 | Masuoka et al. |
| 8,315,097 B2 | 11/2012 | Hishida et al. |
| 8,526,241 B2 | 9/2013 | Shirakawa |

(Continued)

FOREIGN PATENT DOCUMENTS

| | | |
|---|---|---|
| JP | 4756221 B2 | 8/2011 |
| JP | 2012069605 A | 4/2012 |

(Continued)

OTHER PUBLICATIONS

Toshiba Review, vol. 63, No. 2 (2008), pp. 28-31—English abstract.

(Continued)

*Primary Examiner* — Theresa T Doan
(74) *Attorney, Agent, or Firm* — Laurence A. Greenberg; Werner H. Stemer; Ralph E. Locher

(57) ABSTRACT

A semiconductor device has a smaller area. That is, in a row selection decoder including MOS transistors, which selectively connect a plurality of selection signal lines to row selection lines of NAND flash memories having an SGT structure, the MOS transistors are formed on a planar silicon layer that is formed on a substrate, and each have a structure such that a drain, a gate, and a source are disposed in the vertical direction and the gate surrounds a silicon pillar. The planar silicon layer is formed of a first activation region of a first conductivity type and a second activation region of a second conductivity type, and the first and second activation regions are connected with each other via a silicide layer formed on the surface of the planar silicon layer.

19 Claims, 30 Drawing Sheets

(51) Int. Cl.
*H01L 29/16* (2006.01)
*H01L 29/45* (2006.01)

(56) References Cited

U.S. PATENT DOCUMENTS

| | | | |
|---|---|---|---|
| 2010/0213525 | A1 | 8/2010 | Masuoka et al. |
| 2010/0295123 | A1* | 11/2010 | Lung et al. .................... 257/334 |
| 2011/0115011 | A1 | 5/2011 | Masuoka et al. |
| 2011/0215381 | A1* | 9/2011 | Masuoka et al. .............. 257/229 |

FOREIGN PATENT DOCUMENTS

| | | |
|---|---|---|
| JP | 2012146369 A | 8/2012 |
| JP | 5031809 B2 | 9/2012 |
| JP | 5130596 B2 | 1/2013 |
| WO | 2009096468 A1 | 8/2009 |
| WO | 2011043402 A1 | 4/2011 |

OTHER PUBLICATIONS

"Sandjigen NAND Flash, 2015 Nen Ni Honkaku Ryosan E (Three-Dimensional NAND Flash, Full-Scale Mass Production in 2015)", Nikkei Electronics, Sep. 16, 2013, pp. 81-90—English translation of the relevant parts.

Hirokazu Yoshizawa, CMOS OP Amp Kairo Jitsumu Sekkei No Kiso (CMOS OP Amplifier Circuit, Basis of Practical Design) CQ Publishing Co., Ltd., May 15, 2007, p. 23—English translation of relevant parts.

* cited by examiner

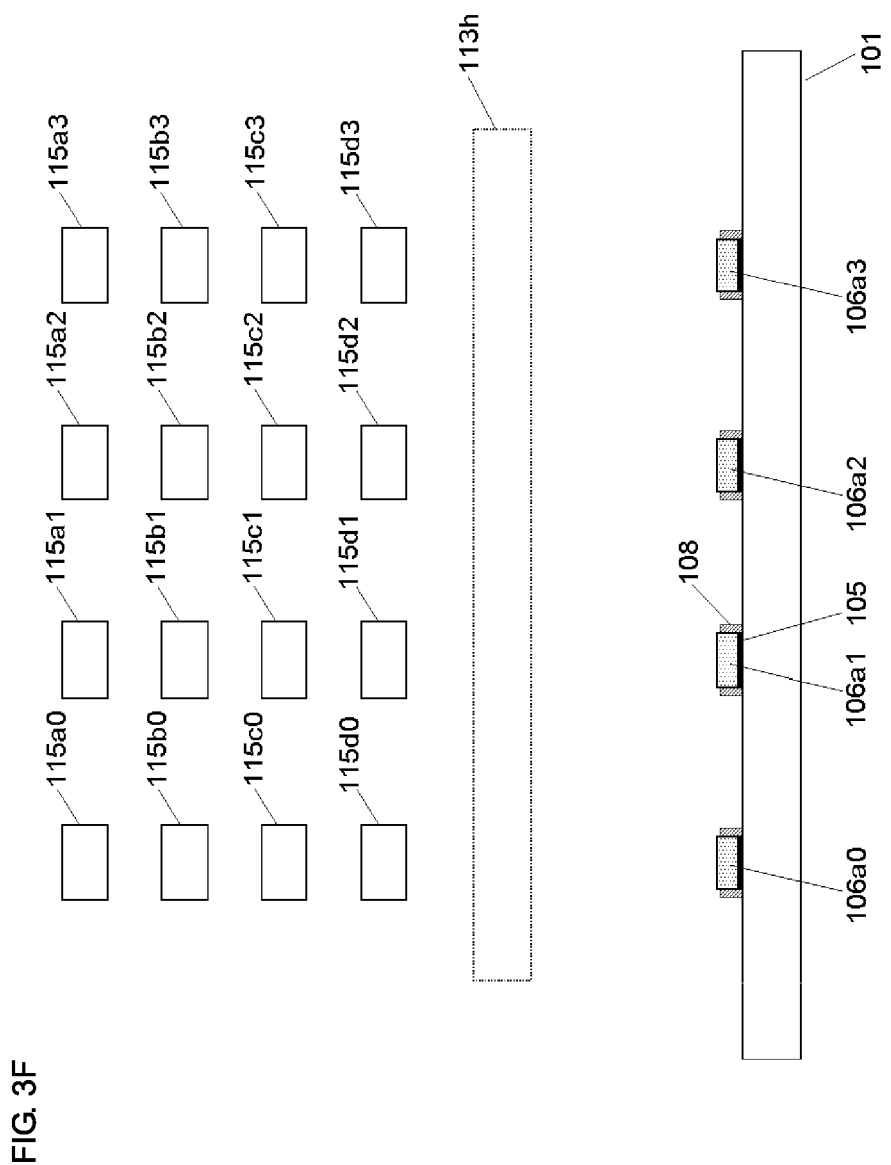

US 9,117,528 B2

SEMICONDUCTOR DEVICE

CROSS REFERENCES TO RELATED APPLICATIONS

The present invention contains subject matter related to Japanese Patent Application No. 2014-008002 filed in the Japan Patent Office on Jan. 20, 2014, the entire contents of which are incorporated herein by reference.

BACKGROUND OF THE INVENTION

Field of the Invention

The present invention relates to a semiconductor device.

Recently, the miniaturization of bulk memories, typically, NAND flash memories, has seemed to approach its limit. In order to further lower the price per bit, various NAND flash memories having a three-dimensional structure have been proposed as described in Japanese Unexamined Patent Application Publication No. 2012-146369, Toshiba Review Vol. 63, No. 2 (2008), pp. 28-31, and "SANJIGEN NAND FLASH, 2015 NEN NI HONKAKU RYOSAN E (Three-Dimensional NAND Flash, Full-Scale Mass Production in 2015)", Nikkei Electronics, Sep. 16, 2013, pp. 81-90.

By employing a three-dimensional structure in memory cells, the area of memories is substantially reduced. However, peripheral circuits, such as a decoder, are manufactured by using planar transistors, that is, by using a complementary metal-oxide semiconductor (CMOS) planar process, based on the related art, as described in Hirokazu Yoshizawa, CMOS OP AMP KAIRO JITSUMU SEKKEI NO KISO (CMOS OP Amplifier Circuit, Basis of Practical Design), CQ Publishing Co., Ltd., May 15, 2007, p. 23. Accordingly, it is expected that planar miniaturization based on the related art alone will not promote further increase in capacity and decrease in price.

As a solution to address the above-described issue, a surrounding gate transistor (SGT) having a structure, in which the source, the gate, and the drain are disposed in a direction perpendicular to a substrate and the gate surrounds the island-shaped semiconductor layers, has been proposed, and a method for manufacturing SGTs, a CMOS inverter using SGTs, and a NAND circuit using SGTs have been disclosed (see Japanese Patent No. 5130596, Japanese Patent No. 5031809, and Japanese Patent No. 47566221, for example).

NAND flash memory cells according to the related art using SGTs and having a three-dimensional structure are illustrated in FIGS. 7, 8A, 8B, and 8C. The details are described in Japanese Unexamined Patent Application Publication No. 2012-146369, Toshiba Review Vol. 63, No. 2 (2008), pp. 28-31, and "SANJIGEN NAND FLASH, 2015 NEN NI HONKAKU RYOSAN E (Three-Dimensional NAND Flash, Full-Scale Mass Production in 2015)", Nikkei Electronics, Sep. 16, 2013, pp. 81-90, and therefore, a brief description will be given below.

FIG. 7 is a diagram of an equivalent circuit including memory cell units of a NAND flash memory having a NAND configuration, which are arranged in a matrix form. M0 to M31 denote floating-type memory elements (transistors) that store charge on the floating gates or charge-trap-type memory elements (transistors) that store charge on nitride films, and are NAND-connected in series. STD denotes a drain selection transistor that is provided on the drain side in order to selectively connect the NAND-connected memory element group to a bit line, and STS denotes a source selection transistor that is provided on the source side in order to selectively connect the NAND-connected memory element group to a source line.

A NAND group in which the drain selection transistor STD, the memory elements M0 to M31, and the source selection transistor STS are connected in series is assumed to be one NAND unit (referred to as a NAND string) of a NAND flash memory. In FIG. 7, four NAND strings are provided to constitute a matrix.

That is, a NAND string NAND(j, k) constituted by STD, M0 to M31, and STS is disposed in a vertical stacking manner between a bit line BLk and a source line SL such that the bit line is positioned on an upper layer and the source line is positioned on a lower layer. Similarly, a NAND string NAND (j+1, k) is connected between the bit line BLk and the source line SL. A NAND string NAND(j, k+1) is connected between a bit line BL(k+1) and a source line SL, and a NAND string NAND(j+1, k+1) is connected between the bit line BL(k+1) and the source line SL. These NAND strings NAND(j, k), NAND(j+1, k), NAND(j, k+1), and NAND(j+1, k+1) constitute a matrix.

To the gates of STD, M0 to M31, and STS of NAND(j, k) and to the gates of STD, M0 to M31, and STS of NAND(j, k+1), a drain selection signal SGDj, word line selection signals WL0j to WL31j, and a source selection signal SGSj are input, respectively.

To the gates of STD, M0 to M31, and STS of NAND(j+1, k) and to the gates of STD, M0 to M31, and STS of NAND (j+1, k+1), a drain selection signal SGD(j+1), word line selection signals WL0(j+1) to WL31(j+1), and a source selection signal SGS(j−1) are input, respectively.

FIG. 8A is a plan view of a layout in which the NAND flash memory cells in FIG. 7 are formed by using SGTs. FIG. 8B is a cross-sectional view taken along cut line A-A' in the plan view in FIG. 8A, and FIG. 8C is a cross-sectional view taken along cut line B-B' in the plan view in FIG. 8A.

In FIGS. 8A, 8B, and 8C, on an insulating film, such as a buried oxide (BOX) layer 1M, formed on a substrate, a planar silicon layer 2M is formed, and the planar silicon layer 2M is formed of an $n^+$ diffusion layer by impurity implantation or the like. Reference numeral 3M denotes a silicide layer formed on the surface of the planar silicon layer 2M. Reference numerals 4M(j, k), 4M(j+1, k), 4M(j, k+1), and 4M(j+1, k+1) denote p-type silicon pillars. Reference numeral 5M denotes a gate insulating film for each of the n-channel metal-oxide semiconductor (hereinafter referred to as NMOS) transistors STD and the NMOS STS, which surrounds the silicon pillars 4M(j, k), 4M(j+1, k), 4M(j, k+1), and 4M(j+1, k+1). Reference numeral 51M denotes a gate insulating film for each of the memory elements M0 to M31, which surrounds the silicon pillars 4M(j, k), 4M(j+1, k), 4M(j, k+1), and 4M(j+1, k+1). Reference numerals 6Msdj, 6M0j to 6M31j, 6Mssj, 6Msd(j+1), 6M0(j+1) to 6M31(j+1), and 6Mss(j+1) denote gate electrodes that also serve as gate lines. On the top of each of the silicon pillars 4M(j, k), 4M(j+1, k), 4M(j, k+1), and 4M(j+1, k+1), an $n^+$ diffusion layer 7M is formed by impurity implantation or the like, and a metal line 16Mk or a metal line 16M(k+1) that serves as the bit line BLk or the bit line BL(k+1) is connected to the corresponding $n^+$ diffusion layer 7M.

The NAND string NAND(j, k) is formed by using NAND connection in which the NMOS transistor STD, the memory elements M0 to M31, and the NMOS transistor STS are connected in series such that the source of an element is connected to the drain of a subsequent element, the NMOS transistor STD being constituted by the silicon pillar 4M(j, k), the gate insulating film 5M, and the gate electrode 6Msdj, the memory element M0 being constituted by the silicon pillar 4M(j, k), the gate insulating film 51M, and the gate electrode 6M0j, the memory element M31 being constituted by the silicon pillar 4M(j, k), the gate insulating film 51M, and the gate electrode 6M31j, the NMOS transistor STS being constituted by the silicon pillar 4M(j, k), the gate insulating film 5M, and the gate electrode 6Mssj. The n⁺ diffusion layer 7M on the top of the silicon pillar 4Mj, which serves as the drain of the NMOS transistor STD is connected to the bit line BLk, which is the metal line 16Mk, and the source of the NMOS transistor STS is connected to the lower diffusion layer 2M, thereby being connected to the source line SL.

The other NAND strings NAND(j+1, k), NAND(j, k+1), and NAND(j+1, k+1) also have similar configurations.

The gate electrodes 6Msdj, 6M0j to 6M31j, and 6Mssj, which also serve as gate lines, of the NMOS transistor STD, the memory elements M0 to M31, and the NMOS transistor STS that constitute NAND(j, k) are laterally connected to the gate electrodes 6Msdj, 6M0j to 6M31j, and 6Mssj, which also serve as gate lines, of the NMOS transistor STD, the memory elements M0 to M31, and the NMOS transistor STS that constitute NAND(j, k+1), respectively on respective layers, in FIG. 8A.

Similarly, the gate electrodes 6Msd(j+1), 6M0(j+1) to 6M31(j+1), and 6Mss(j+1), which also serve as gate lines, of the NMOS transistor STD, the memory elements M0 to M31, and the NMOS transistor STS that constitute NAND(j+1, k) are laterally connected to the gate electrodes 6Msd(j+1), 6M0(j+1) to 6M31(j+1), and 6Mss(j+1), which also serve as gate lines, of the NMOS transistor STD, the memory elements M0 to M31, and the NMOS transistor STS that constitute NAND(j+1, k+1), respectively on respective layers, in FIG. 8A.

The bit line 16Mk to which the NAND strings NAND(j, k) and NAND(j+1, k) are connected and the bit line 16M(k+1) to which the NAND strings NAND(j, k+1) and NAND(j+1, k+1) are connected are disposed in the vertical direction extending in the up-down direction in FIG. 8A.

When an SGT-NAND flash memory, which is a three-dimensional NAND flash memory having the above-described configuration, is used, memory elements on 32 layers are vertically stacked in the NAND flash memory, and therefore, the degree of integration of memory elements is substantially increased and the price of the memory can be decreased.

However, 34 signals SGDj, WL0j to WL31j, and SGSj, that is, the gate electrodes 6Msdj, 6M0j to 6M31j, and 6Mssj illustrated in FIG. 8B overlap in one location as illustrated in FIG. 8A. Accordingly, a decoder circuit for selecting any of these 34 signals, which is formed by using a planar process, that is, by using a planar transistor in the related art, requires a substantial area. As a result, even if the area of memory elements is reduced, the area of a peripheral circuit, such as a decoder, increases, and therefore, the reduction is not effective in terms of the total area of the chip and the benefit specific to an SGT memory is not sufficiently gained, which has been an issue.

On the other hand, in an inverter using SGTs illustrated in FIGS. 9, 10A, and 10B, the p-channel metal-oxide semiconductor (hereinafter referred to as PMOS) transistor is completely isolated from the NMOS transistor in the structure, well isolation as in planar transistors is not needed, and a body terminal for supplying a potential to a well as in planar transistors is not needed because the silicon pillars serve as floating bodies. Accordingly, the inverter is characterized by a very compact layout (arrangement).

FIG. 9 and FIGS. 10A and 10B are a circuit diagram and layout charts of an inverter that uses SGTs in the related art.

FIG. 9 is a circuit diagram of the inverter in which Qp denotes a PMOS transistor, Qn denotes an NMOS transistor, IN denotes an input signal, OUT denotes an output signal, Vcc denotes a supply voltage, and Vss denotes a reference voltage. FIG. 10A is a plan view of a layout in which the inverter in FIG. 9 is formed by using SGTs, for example. FIG. 10B is a cross-sectional view taken along cut line A-A' in the plan view in FIG. 10A.

In FIGS. 10A and 10B, on an insulating film, such as a BOX layer 1, formed on a substrate, planar silicon layers 2p and 2n are formed, and the planar silicon layers 2p and 2n are formed of a p⁺ diffusion layer and an n⁺ diffusion layer, respectively, by impurity implantation or the like. Reference numeral 3 denotes a silicide layer formed on the surface of the planar silicon layers 2p and 2n, which connects the planar silicon layers 2p and 2n with each other. Reference numeral 4n denotes an n-type silicon pillar, and reference numeral 4p denotes a p-type silicon pillar. Reference numeral 5 denotes a gate insulating film that surrounds the silicon pillars 4n and 4p. Reference numeral 6 denotes a gate electrode, and reference numeral 6a denotes a gate line. On the top of each of the silicon pillars 4n and 4p, a p+ diffusion layer 7p and an n+ diffusion layer 7n are respectively formed by impurity implantation or the like. Reference numeral 8 denotes a silicon nitride film for protecting the gate insulating film 5 and the like. Reference numerals 9p and 9n denote silicide layers respectively connected to the p⁺ diffusion layer 7p and the n⁺ diffusion layer 7n. Reference numeral 10p denotes a contact that connects the silicide layer 9p with a metal line 13a, and reference numeral 10n denotes a contact that connects the silicide layer 9n with a metal line 13b. Reference numeral 11 denotes a contact that connects the gate line 6a with a metal line 13c.

The PMOS transistor Qp is constituted by the silicon pillar 4n, the lower diffusion layer 2p, the upper diffusion layer 7p, the gate insulating film 5, and the gate electrode 6, and the NMOS transistor Qn is constituted by the silicon pillar 4p, the lower diffusion layer 2n, the upper diffusion layer 7n, the gate insulating film 5, and the gate electrode 6. The upper diffusion layers 7p and 7n serve as sources, and the lower diffusion layers 2p and 2n serve as drains. The supply voltage Vcc is supplied to the metal line 13a, and the reference voltage Vss is supplied to the metal line 13b. The input signal IN is connected to the metal line 13c. The silicide layer 3 that connects the drain diffusion layer 2p of the PMOS transistor Qp with the drain diffusion layer 2n of the NMOS transistor Qn corresponds to the output OUT.

In the inverter using SGTs illustrated in FIGS. 9, 10A, and 10B, the PMOS transistor is completely isolated from the NMOS transistor in the structure, well isolation as in planar transistors is not needed, and a body terminal for supplying a potential to a well as in planar transistors is not needed because the silicon pillars serve as floating bodies. Accordingly, the inverter is characterized by a very compact layout (arrangement).

SUMMARY OF THE INVENTION

The present invention provides a semiconductor device having a minimum area with a low price by configuring a decoder having a reduced area for an SGT-NAND flash memory, using the above-described feature of SGTs.

A semiconductor device according to an aspect of the present invention is a semiconductor device including a decoder. The decoder includes a plurality of transistors arranged on a substrate, each of the plurality of transistors being formed by disposing a source, a drain, and a gate in layers in a direction perpendicular to the substrate. Each of the plurality of transistors includes a silicon pillar, an insulator that surrounds a side surface of the silicon pillar, a gate that surrounds the insulator, a source region that is disposed on the top or on the bottom of the silicon pillar, and a drain region that is disposed on the top or on the bottom of the silicon pillar, the drain region being disposed on an opposite side of the silicon pillar to the source region. The decoder includes at least a first selection signal line, n second selection signal lines, where n is a natural number, n MOS transistors, and n output lines. The n MOS transistors have gates that are connected to the first selection signal line. A k-th MOS transistor, where k=1 to n, has a source region and a drain region, one of the source region and the drain region being connected to any one of the n output lines. Another of the source region and the drain region of the k-th MOS transistor is disposed on the bottom of the silicon pillar, and is connected to a k-th selection signal line among the second selection signal lines, via a silicide layer that is disposed closer to the substrate than the silicon pillar.

Preferably, the semiconductor device includes a plurality of the decoders, each of the plurality of the decoders including the n MOS transistors; and the other of the source region and the drain region of each k-th MOS transistor of each set of n MOS transistors that constitutes the plurality of the decoders is connected to a lower diffusion layer via the silicide layer.

Preferably, the n output lines are formed as lines of a first wiring layer to an n-th wiring layer, respectively, and are disposed so as to extend in a first direction; and the lower diffusion layer to which the other of the source region and the drain region of each k-th MOS transistor is connected and the silicide layer that covers the lower diffusion layer are disposed so as to extend in a second direction perpendicular to the first direction.

Preferably, the second selection signal lines are lines of a first metal wiring layer, which are disposed so as to extend in the second direction; and each of the lines of the first metal wiring layer is connected to the silicide layer that covers the lower diffusion layer via a contact.

Preferably, the lines of the first metal wiring layer, which are disposed so as to extend in the second direction, are disposed below the lines formed in the first wiring layer to the n-th wiring layer, which are disposed so as to extend in the first direction.

Preferably, the second selection signal lines are lines of a second metal wiring layer, which are disposed so as to extend in the second direction; each of the lines of the second metal wiring layer is connected to the silicide layer that covers the lower diffusion layer via a contact; and the lines of the second metal wiring layer are disposed above the lines of the first wiring layer to the n-th wiring layer.

Preferably, the first wiring layer is made of a metal compound.

A semiconductor device according to an aspect of the present invention is a semiconductor device including a decoder circuit. The decoder circuit includes a plurality of transistors arranged on a substrate, each of the plurality of transistors being formed by disposing a source, a drain, and a gate in layers in a direction perpendicular to the substrate. Each of the plurality of transistors includes a silicon pillar, an insulator that surrounds a side surface of the silicon pillar, a gate that surrounds the insulator, a source region that is disposed on the top or on the bottom of the silicon pillar, and a drain region that is disposed on the top or on the bottom of the silicon pillar, the drain region being disposed on an opposite side of the silicon pillar to the source region. The decoder circuit includes at least a first selection circuit, a first selection signal line output from the first selection circuit, n second selection signal lines, where n is a natural number, n MOS transistors, and n output lines. The n MOS transistors have gates that are connected to the first selection signal line. A k-th MOS transistor, where k=1 to n, has a source region and a drain region, one of the source region and the drain region being connected to any one of the n output lines. Another of the source region and the drain region of the k-th MOS transistor is disposed on the bottom of the silicon pillar, and is connected to a k-th selection signal line among the second selection signal lines, via a silicide layer that is disposed closer to the substrate than the silicon pillar. Each of the n output lines is connected to a gate electrode of a corresponding one of n memory elements.

Preferably, the semiconductor device includes a plurality of the decoder circuits, each of the plurality of the decoder circuits including the n MOS transistors; and the other of the source region and the drain region of each k-th MOS transistor of each set of n MOS transistors that constitutes the plurality of the decoder circuits is connected to a lower diffusion layer via the silicide layer.

Preferably, the n output lines are formed as lines of a first wiring layer to an n-th wiring layer, respectively, and are disposed so as to extend in a first direction; and the lower diffusion layer to which the other of the source region and the drain region of each k-th MOS transistor is connected and the silicide layer that covers the lower diffusion layer are disposed so as to extend in a second direction perpendicular to the first direction.

Preferably, the second selection signal lines are lines of a first metal wiring layer, which are disposed so as to extend in the second direction; and each of the lines of the first metal wiring layer is connected to the silicide layer that covers the lower diffusion layer via a contact.

Preferably, the lines formed in the first metal wiring layer are disposed in a layer below the lines formed in the first wiring layer to the n-th wiring layer.

Preferably, the second selection signal lines are lines of a second metal wiring layer, which are disposed so as to extend in the second direction; each of the lines of the second metal wiring layer is connected to the silicide layer that covers the lower diffusion layer via a contact; and the lines of the second metal wiring layer are disposed above the lines of the first wiring layer to the n-th wiring layer.

Preferably, the first wiring layer is made of a metal compound.

A semiconductor device according to an aspect of the present invention is a semiconductor device including a decoder. The decoder includes a plurality of transistors arranged on a substrate, each of the plurality of transistors being formed by disposing a source, a drain, and a gate in layers in a direction perpendicular to the substrate. Each of the plurality of transistors includes a silicon pillar, an insulator that surrounds a side surface of the silicon pillar, a gate that surrounds the insulator, a source region that is disposed on the top or on the bottom of the silicon pillar, and a drain region that is disposed on the top or on the bottom of the silicon pillar, the drain region being disposed on an opposite side of the silicon pillar to the source region. The decoder includes a first selection circuit, a first selection signal line output from the first selection circuit, n second selection signal lines, where n is a natural number, n MOS transistors, n output lines, and a NAND-connected memory element group that includes n memory elements vertically stacked on the substrate, the n memory elements each including a drain, a source, and a gate electrode, the drain of a memory element being connected to the source of a subsequent memory element. The n MOS transistors are disposed in a column in a first direction, and have gates that are connected to the first selection signal line. A k-th MOS transistor, where k=1 to n, has a source region and a drain region, one of the source region and the drain region being connected to any one of the n output lines that are disposed so as to extend in the first direction. Another of the source region and the drain region of the k-th MOS transistor is disposed on the bottom of the silicon pillar, and is connected to a k-th selection signal line among the second selection signal lines that are disposed so as to extend in a second direction perpendicular to the first direction, via a silicide layer that is disposed closer to the substrate than the silicon pillar. Each of the n output lines is connected to the gate electrode of a corresponding one of the n memory elements in the memory element group.

Preferably, the semiconductor device includes a plurality of the decoders; the plurality of the decoders are disposed side by side in the second direction; each of the plurality of the decoders further includes a second selection circuit that outputs the n second selection signal lines, where n is a natural number; the other of the source region and the drain region of a corresponding k-th MOS transistor among the plurality of the decoders is connected to a lower diffusion layer disposed on the bottom of the silicon pillar via the silicide layer, and is connected to the k-th selection signal line among the second selection signal lines; and a specified one memory element is selected from the memory element group by the first selection circuit and the second selection circuit.

Preferably, the NAND-connected memory element group further includes a source line provided on a substrate side and a bit line provided on a top portion opposite the substrate side; and a first selection transistor, the n memory elements, and a second selection transistor are connected in this order between the bit line and the source line.

Preferably, the second selection signal lines are lines of a first metal wiring layer, which are disposed so as to extend in the second direction; and each of the lines of the first metal wiring layer is connected to the silicide layer that covers a lower diffusion layer via a contact, and is disposed below the lines of the first wiring layer to the n-th wiring layer, which are disposed so as to extend in the first direction.

Preferably, the second selection signal lines are lines of a second metal wiring layer, which are disposed so as to extend in the second direction; and each of the lines of the second metal wiring layer is connected to the silicide layer that covers a lower diffusion layer via a contact, and is disposed above the lines of the first wiring layer to the n-th wiring layer, which are disposed so as to extend in the first direction.

BRIEF DESCRIPTION OF THE SEVERAL VIEWS OF THE DRAWINGS

FIG. 3F is a cross-sectional view of the decoder according to the second embodiment of the present invention;

DESCRIPTION OF THE PREFERRED EMBODIMENTS

Figure 1:
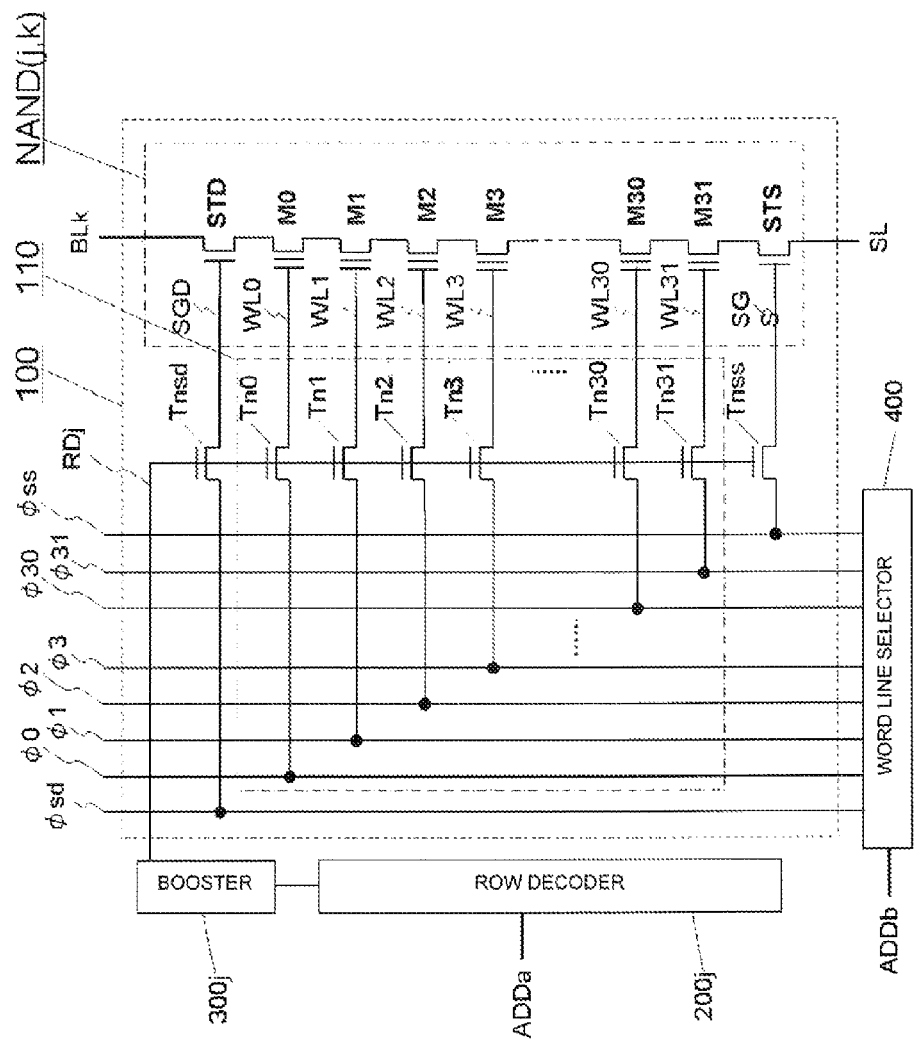
FIG. 1 is a diagram of an equivalent circuit in embodiments of the present invention.
Figure 7:
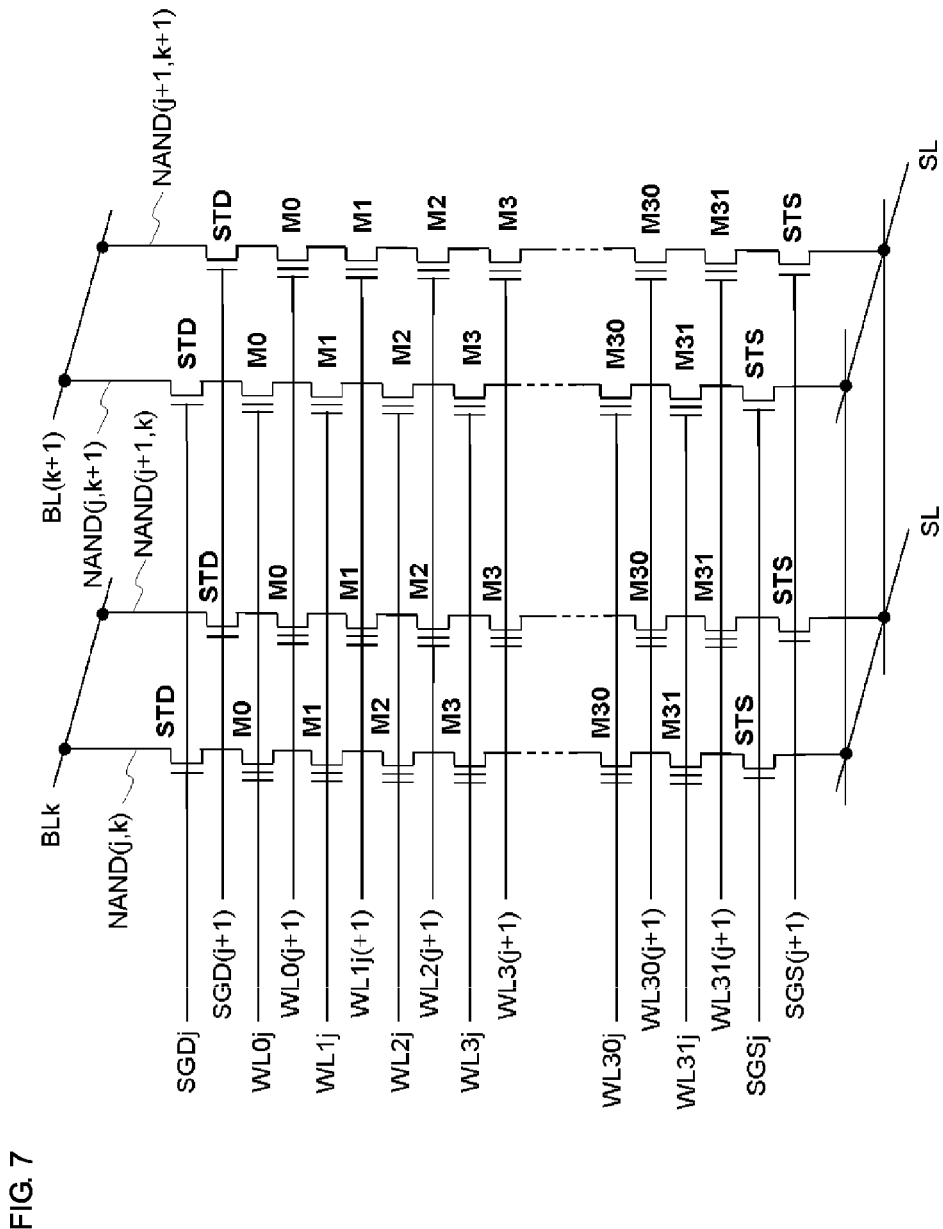
FIG. 7 is a diagram of an equivalent circuit of an SGT-NAND flash memory according to the related art.
Figure 8A:
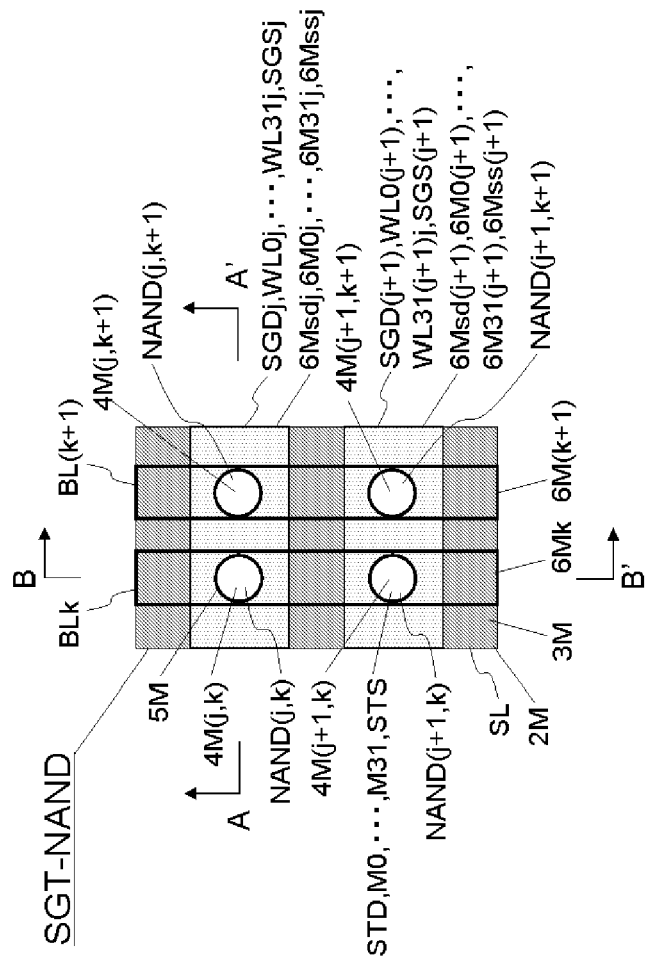
FIG. 8A is a plan view of the SGT-NAND flash memory according to the related art.
Figure 8B:
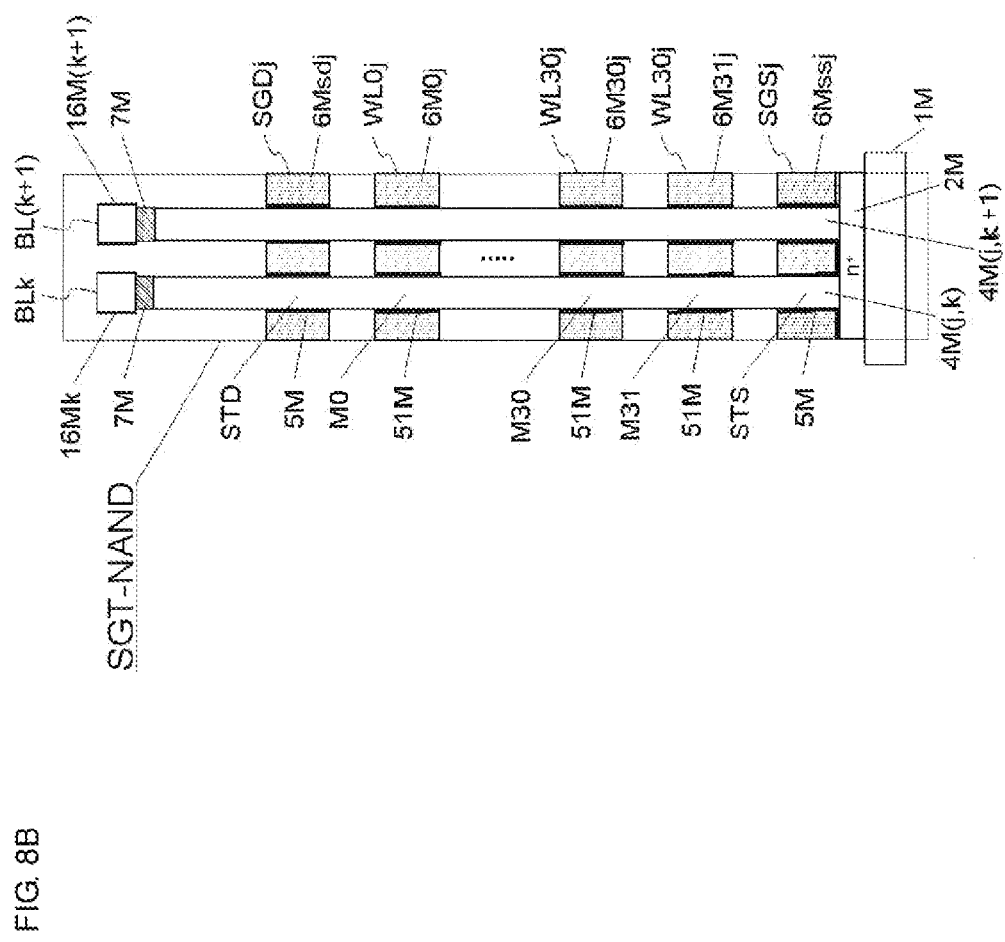
FIG. 8B is a cross-sectional view of the SGT-NAND flash memory according to the related art.
Figure 8C:
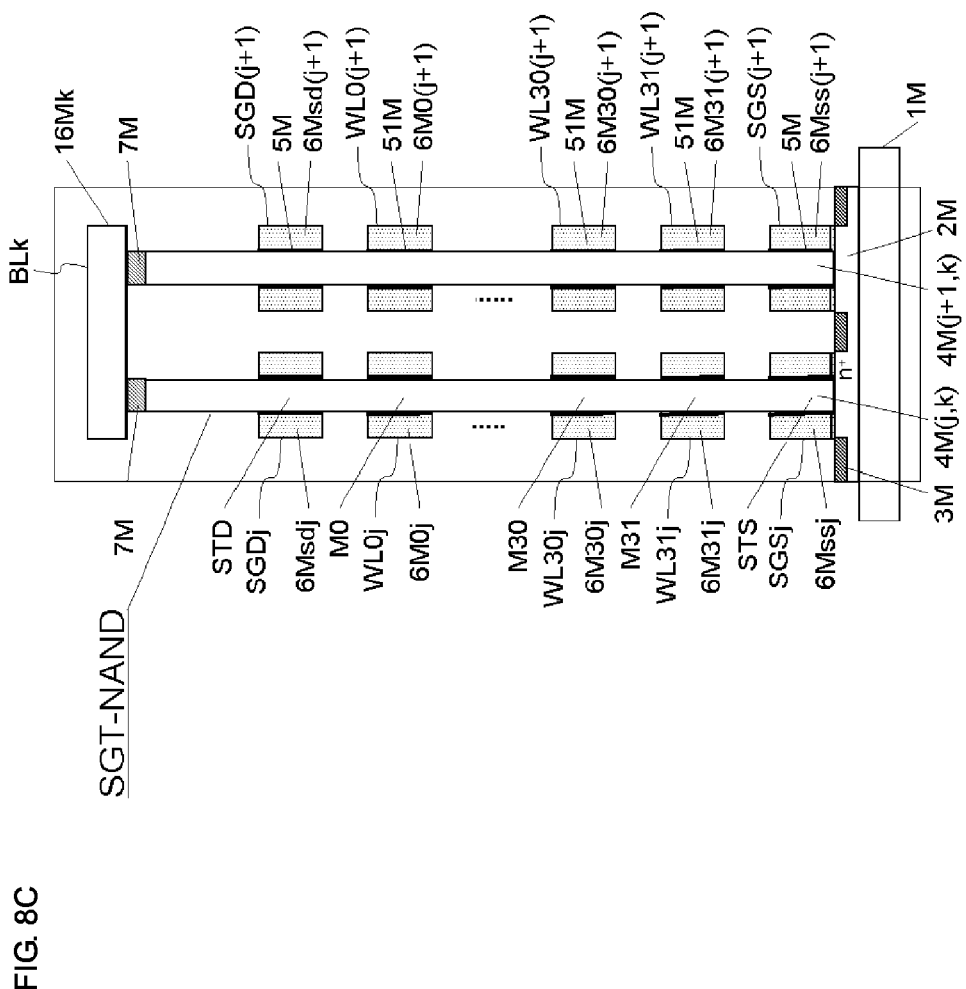
FIG. 8C is a cross-sectional view of the SGT-NAND flash memory according to the related art.
Figure 9:
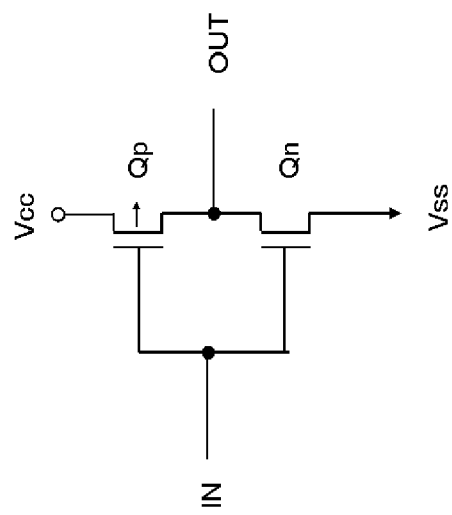
FIG. 9 is a diagram of an equivalent circuit of an inverter.

FIG. 1 illustrates an equivalent circuit of a NAND string selection decoder 100, which is employed in embodiments of the present invention and which is a decoder for an SGT-NAND flash memory. NAND(j, k) denotes the SGT-NAND string illustrated in FIG. 7.

An NMOS transistor Tnsd is a selection transistor that connects a gate SGD of a drain selection transistor STD in the NAND string NAND(j, k) with a selection signal φsd. NMOS transistors Tn0 to Tn31 are selection transistors that connect gate signals WL0 to WL31 of memory elements M0 to M31 with selection signals φ1 to φ31, respectively. An NMOS transistor Tnss is a selection transistor that connects a gate SGS of a source selection transistors STS with a selection signal φss.

The NMOS transistors Tn0 to Tn31 constitute a memory element selection decoder 110 that selects any one of the memory elements M0 to M31. The selection transistors Tnsd and Tnss and the NAND string NAND(j, k) in addition to the memory element selection decoder 110 constitute the NAND string selection decoder 100.

Reference numeral 200j denotes a row decoder that selects the NAND string selection decoder 100, which receives an address signal ADDa and outputs a signal for selecting a NAND string to a booster 300j. The booster 300j outputs a row selection signal RDj, the voltage of which has been boosted. The row selection signal RDj is input to the gates of the NMOS transistors Tnsd, Tn0 to Tn31, and Tnss. A word line selector 400 receives an address signal ADDb, and outputs selection signals φsd, φ0 to φ31, and φss.

Although not illustrated, a plurality of NAND string selection decoders 100 are disposed in the up-down direction in FIG. 1, and the selection signals φsd, φ0 to φ31, and φss, which are output from the word line selector 400, are fed to each of the plurality of NAND string selection decoders 100.

That is, a NAND string selection decoder 100 is selected when the address signal ADDa from the row decoder 200j matches the address signal ADDb from the word line selector 400.

For example, when the address signal ADDa from the row decoder 200j matches the address signal ADDb and the row selection signal RDj is output from the booster 300j, the NMOS transistors Tnsd, Tn0 to Tn31, and Tnss are turned on, and the selection signals φsd, φ0 to φ31, and φss are fed to the gates of the drain selection transistor STD, the memory elements M0 to M31, and the source selection transistor STS, respectively.

Here, a case of reading data of a memory element M3 in a read mode will be discussed. A voltage of approximately 5 V is applied to the signals φsd and φss, the drain selection transistor STD and the source selection transistor STS are turned on, and the NAND string NAND(j, k) is connected to a bit line BLk and a source line SL.

The memory element M3 is selected, and therefore, the voltage of the selection signal φ3 becomes substantially 0 V, and the voltage of the gate WL3 of the memory element M3 becomes substantially 0 V. On the other hand, a voltage of approximately 5 V is output to the selection signals φ0 to φ2 and φ4 to φ31 that are not selected. In this state, in a case where data of the memory element M3 is in an erase state of "1", the threshold of the memory element M3 is negative, and therefore, the memory element M3 is turned on even if the voltage of the gate WL3 is 0 V, and a current flows from the bit line BLk to the source line SL. A sense amplifier, which is not illustrated, detects the current and determines that the data is "1".

On the other hand, in a state where data of the memory element 3 is "0", the threshold of the memory element 3 is positive, and therefore, the memory element M3 is turned off if the gate voltage is 0 V, no current flows from the bit line BLk to the source line SL, and the sense amplifier, which is not illustrated, determines that the data is "0".

Note that the NMOS transistors Tnsd, Tn0, . . . , Tn31, and Tnss operate as transfer gates, and therefore, the positions of the drains and the sources (orientations) are switched as appropriate in accordance with a direction in which the current flows. Here, for convenience sake, a state in a case where currents flow respectively from selection signal lines φsd, φ0, . . . , φ31, and φss to the gates SGD, WL0, . . . , WL31, and SGS in the NAND string is assumed, and the drains of the selection transistors Tnsd, Tn0, . . . , Tn31, and Tnss are specified to be connected to the selection signal lines φsd, φ0, . . . , φ31, and φss, and description will be given below.

First Embodiment

Figure 2A:
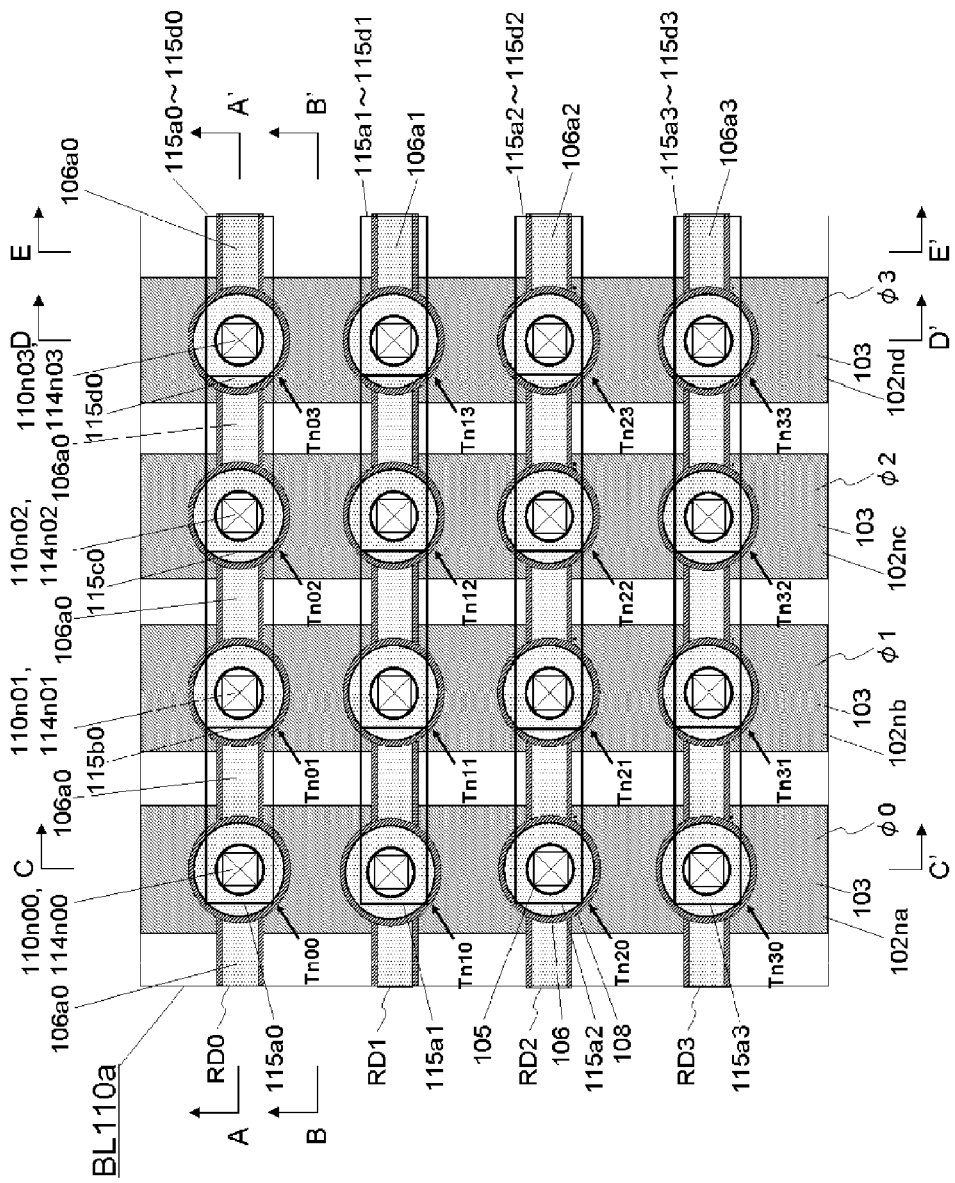
FIG. 2A is a plan view of a decoder according to a first embodiment of the present invention.
Figure 2B:
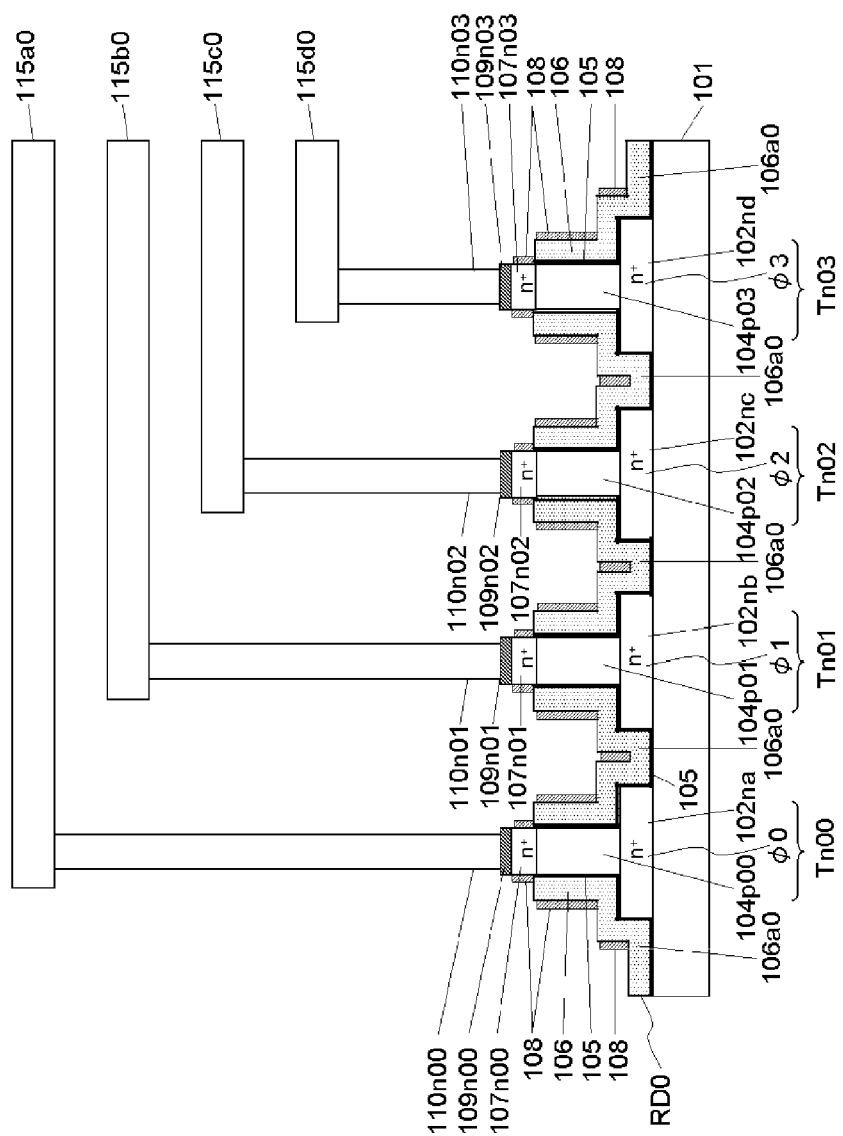
FIG. 2B is a cross-sectional view of the decoder according to the first embodiment of the present invention.
Figure 2C:
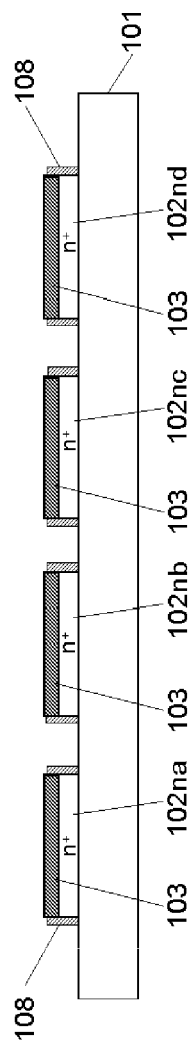
FIG. 2C is a cross-sectional view of the decoder according to the first embodiment of the present invention.
Figure 2D:
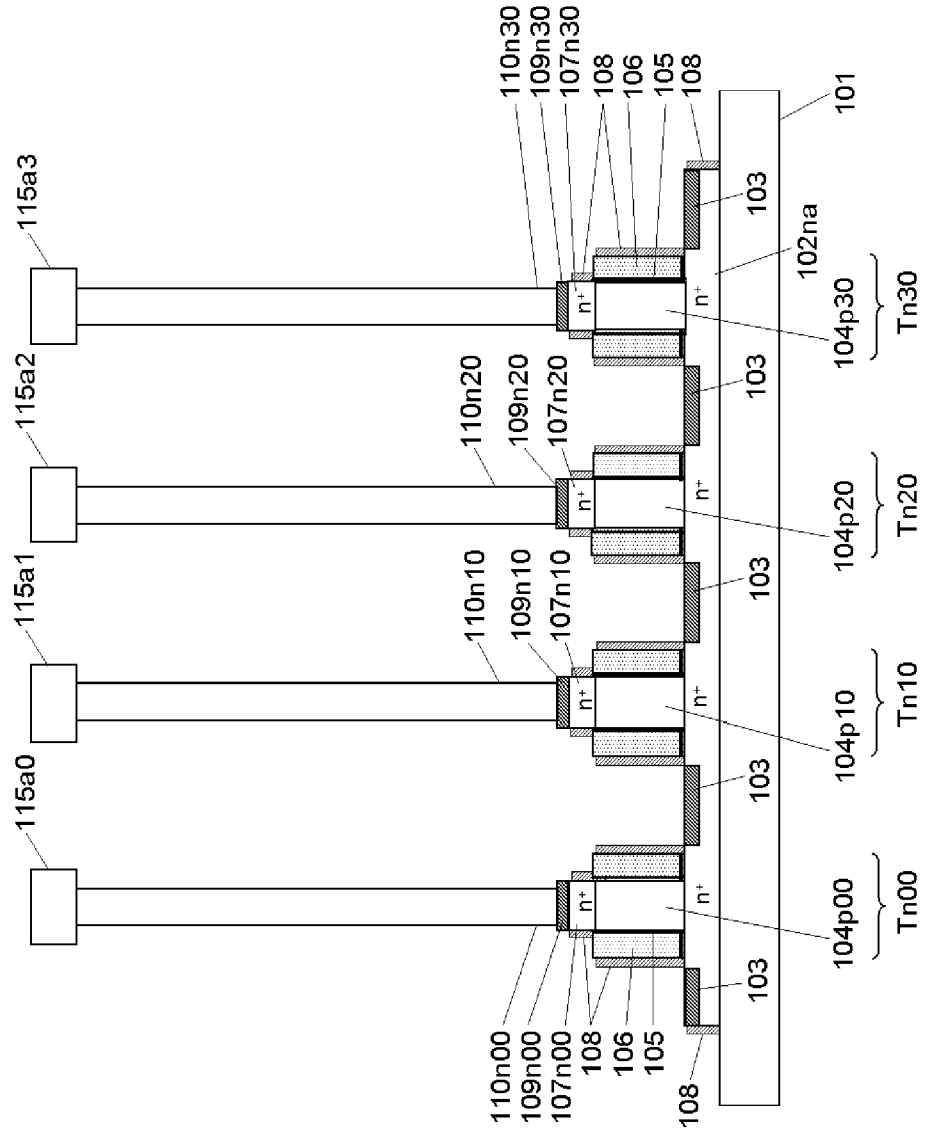
FIG. 2D is a cross-sectional view of the decoder according to the first embodiment of the present invention.
Figure 2E:
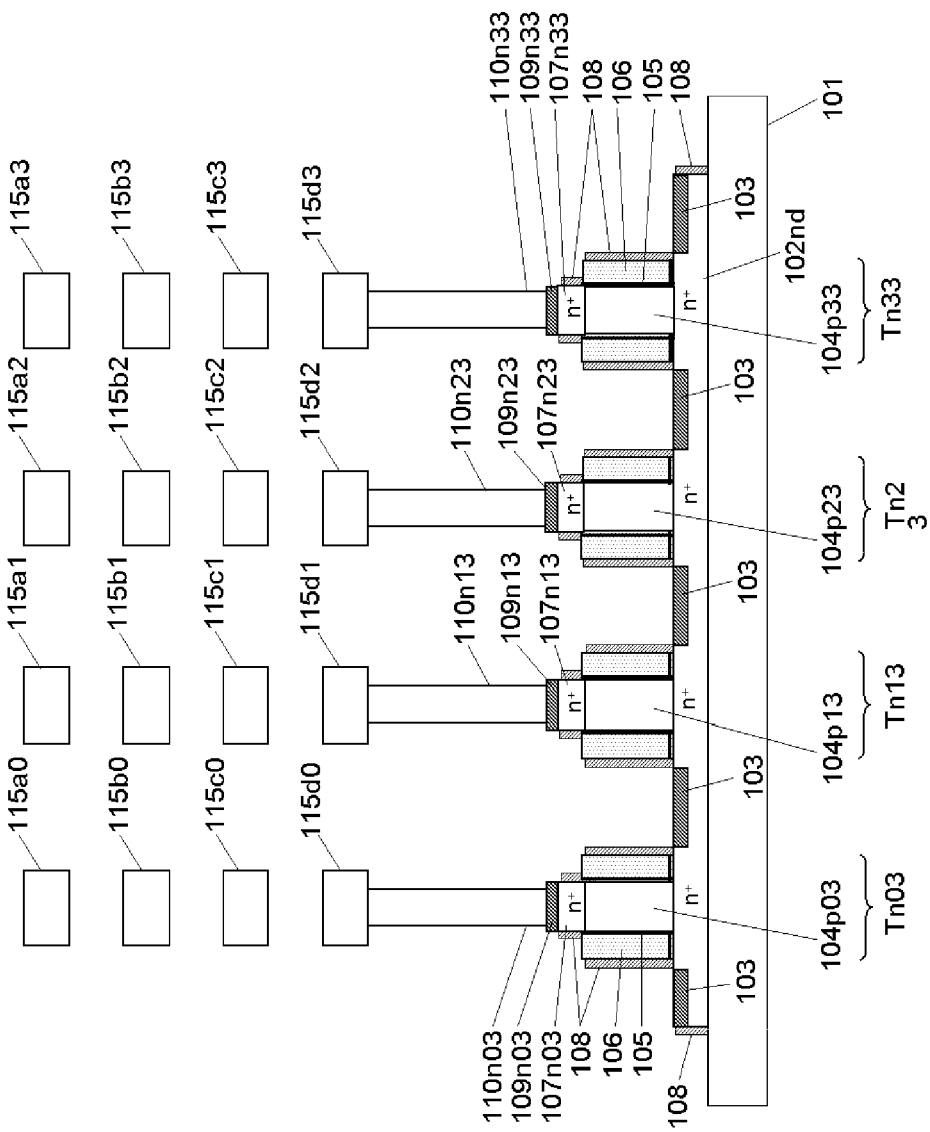
FIG. 2E is a cross-sectional view of the decoder according to the first embodiment of the present invention.
Figure 2F:
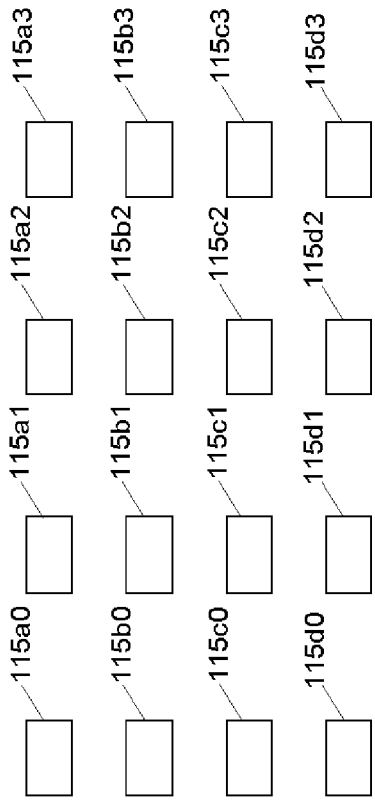
FIG. 2F is a cross-sectional view of the decoder according to the first embodiment of the present invention.
Figure 2F:
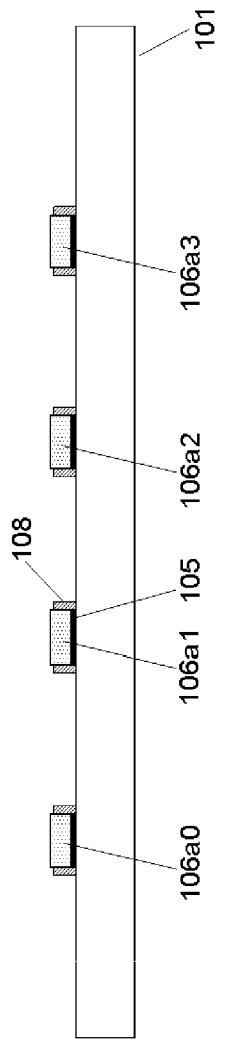

A first embodiment is illustrated in FIGS. 2A, 2B, 2C, 2D, 2E, and 2F. FIG. 2A is a plan view of a layout (arrangement) of a word line selection decoder according to this embodiment of the present invention. FIG. 2B is a cross-sectional view taken along cut line A-A' in FIG. 2A. FIG. 2C is a cross-sectional view taken along cut line B-B' in FIG. 2A. FIG. 2D is a cross-sectional view taken along cut line C-C' in FIG. 2A. FIG. 2E is a cross-sectional view taken along cut line D-D' in FIG. 2A. FIG. 2F is a cross-sectional view taken along cut line E-E' in FIG. 2A. An equivalent circuit in this embodiment is based on the memory element selection decoder 110 in FIG. 1.

FIGS. 2A to 2F illustrate a case where j=3 in FIG. 1. In FIG. 2A, selection transistors Tn00, Tn01, Tn02, and Tn03 are disposed in order in the lateral direction (first direction) in a row, on the top of FIG. 2A. This row is defined as the first row. Gate electrodes 106 of the selection transistors Tn00, Tn01, Tn02, and Tn03 are connected with each other by a gate line 106a0 that extends in the lateral direction, and a row selection signal RD0 from the booster 300j illustrated in FIG. 1 is input to the gate line 106a0.

Similarly, selection transistors Tn10 to Tn13 are disposed in order, as the second row below the first row, a gate line 106a1 is connected to the gate electrodes, and a row selection signal RD1 is input to the gate line 106a1. In the third row and in the fourth row, selection transistors Tn20 to Tn23 and selection transistors Tn30 to Tn33 are respectively disposed, a gate line 106a2 and a gate line 106a3 are connected to the corresponding gate electrodes respectively, and a row selection signal RD2 and a row selection signal RD3 are respectively input to the gate line 106a2 and the gate line 106a3.

In such arrangement, the selection transistors Tn00, Tn10, Tn20, and Tn30 in the respective rows are longitudinally disposed in a column (second direction) on the left side in FIG. 2A. This column is defined as the first column. Similarly, the selection transistors Tn01, Tn11, Tn21, and Tn31 in the respective rows are disposed in the second column, the selection transistors Tn02, Tn12, Tn22, and Tn32 in the respective rows are disposed in the third column, and the selection transistors Tn03, Tn13, Tn23, and Tn33 in the respective rows are disposed in the fourth column. That is, the selection transistors are arranged in a matrix form.

Although detailed description will be given below, in the first column, a selection signal line φ0 is disposed so as to longitudinally extend by using a lower diffusion layer, and is connected to the lower diffusion layer, which serves as the drains of the selection transistors Tn00, Tn10, Tn20, and Tn30 disposed in the respective rows, via a silicide layer. Similarly, in the second column, a selection signal line φ1 is disposed so as to longitudinally extend by using a lower diffusion layer, and is connected to the lower diffusion layer, which serves as the drains of the selection transistors Tn01, Tn11, Tn21, and Tn31 disposed in the respective rows, via a silicide layer. In the third column, a selection signal line φ2 is disposed so as to longitudinally extend by using a lower diffusion layer, and is connected to the lower diffusion layer, which serves as the drains of the selection transistors Tn02, Tn12, Tn22, and Tn32 disposed in the respective rows, via a silicide layer. In the fourth column, a selection signal line φ3 is disposed so as to longitudinally extend by using a lower diffusion layer, and is connected to the lower diffusion layer, which serves as the drains of the selection transistors Tn03, Tn13, Tn23, and Tn33 disposed in the respective rows, via a silicide layer.

In the first row, lines 115a0 to 115d0 of the first to fourth metal compound wiring layers (wiring layers made of a metal compound, such as silicide) connected to memory elements, which are not illustrated, are overlap one another and are disposed so as to extend in the longitudinal and lateral directions. The line 115*a*0 is connected to the upper source of the selection transistor Tn00, the line 115*b*0 is connected to the upper source of the selection transistor Tn01, the line 115*c*0 is connected to the upper source of the selection transistor Tn02, and the line 115*d*0 is connected to the upper source of the selection transistor Tn03.

Similarly, in the second row, lines 115*a*1 to 115*d*1 respectively formed in the first to fourth metal compound wiring layers are disposed. In the third row, lines 115*a*2 to 115*d*2 respectively formed in the first to fourth metal compound wiring layers are disposed. In the fourth row, lines 115*a*3 to 115*d*3 respectively formed in the first to fourth metal compound wiring layers are disposed.

As described above, 16 selection transistors that constitute a decoder circuit for selecting the memory elements M0 to M3 of the NAND strings NAND(0, 0), NAND(1, k), NAND (2, k), and NAND(3, k), which are not illustrated, are efficiently arranged in a matrix form to thereby implement a row selection decoder having a reduced area.

Figure 10A:
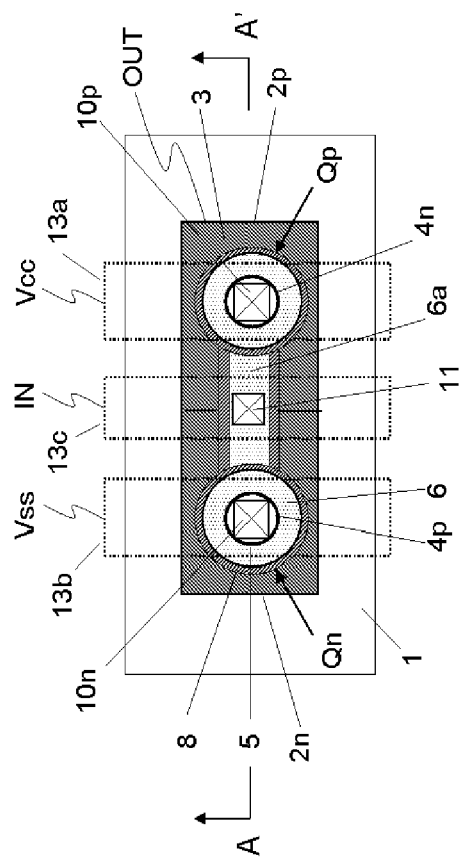
FIG. 10A is a plan view of the inverter according to the related art using SGTs.
Figure 10B:
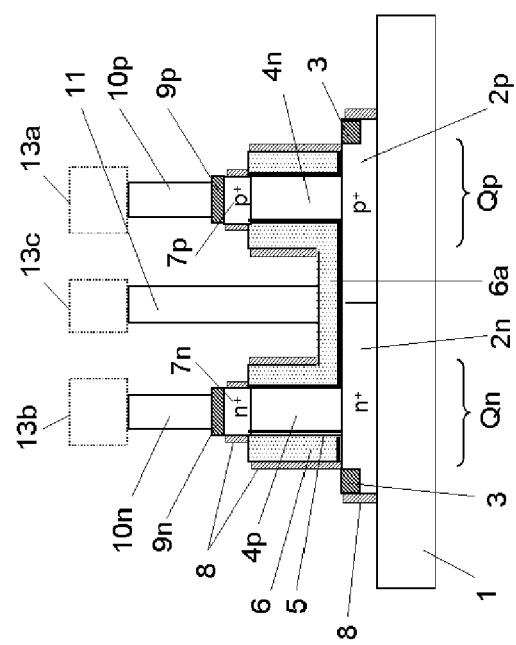
FIG. 10B is a cross-sectional view of the inverter according to the related art using SGTs.

Note that, in FIGS. 2A, 2B, 2C, 2D, 2E, and 2F, a portion having the same structure as the corresponding one in FIGS. 10A and 10B is denoted by a corresponding reference numeral in the one hundreds.

In FIGS. 2A, 2B, 2C, 2D, 2E, and 2F, planar silicon layers 102*na*, 102*nb*, 102*nc*, and 102*nd* are formed on an insulating film, such as a BOX layer 101, formed on a substrate. The planar silicon layers 102*na*, 102*nb*, 102*nc*, and 102*nd* are respectively formed of $n^+$ diffusion layers formed by impurity implantation or the like. Reference numeral 103 denotes a silicide layer formed on the surface of each of the planar silicon layers 102*na*, 102*nb*, 102*nc*, and 102*nd*. Reference numerals 104*p*00, 104*p*01, 104*p*02, 104*p*03, 104*p*10, 104*p*11, 104*p*12, 104*p*13, 104*p*20, 104*p*21, 104*p*22, 104*p*23, 104*p*30, 104*p*31, 104*p*32, and 104*p*33 each denote a p-type silicon pillar. Reference numeral 105 denotes a gate insulating film that surrounds the silicon pillars 104*p*00, 104*p*01, 104*p*02, 104*p*03, 104*p*10, 104*p*11, 104*p*12, 104*p*13, 104*p*20, 104*p*21, 104*p*22, 104*p*23, 104*p*30, 104*p*31, 104*p*32, and 104*p*33. Reference numeral 106 denotes the gate electrode. Reference numerals 106*a*0, 106*a*1, 106*a*2, and 106*a*3 each denote the gate line. The gate insulating film 105 is also formed under the gate electrode 106 and the gate lines 106*a*0, 106*a*1, 106*a*2, and 106*a*3.

On the top portions of the silicon pillars 104*p*00, 104*p*01, 104*p*02, 104*p*03, 104*p*10, 104*p*11, 104*p*12, 104*p*13, 104*p*20, 104*p*21, 104*p*22, 104*p*23, 104*p*30, 104*p*31, 104*p*32, and 104*p*33, $n^+$ diffusion layers 107*n*00, 107*n*01, 107*n*02, 107*n*03, 107*n*10, 107*n*11, 107*n*12, 107*n*13, 107*n*20, 107*n*21, 107*n*22, 107*n*23, 107*n*30, 107*n*31, 107*n*32, and 107*n*33 are respectively formed by impurity implantation or the like. Reference numeral 108 denotes a silicon-nitride film for protecting the gate insulating film 105. Reference numerals 109*n*00, 109*n*01, 109*n*02, 109*n*03, 109*n*10, 109*n*11, 109*n*12, 109*n*13, 109*n*20, 109*n*21, 109*n*22, 109*n*23, 109*n*30, 109*n*31, 109*n*32, and 109*n*33 denote silicide layers connected to the $n^+$ diffusion layers 107*n*00, 107*n*01, 107*n*02, 107*n*03, 107*n*10, 107*n*11, 107*n*12, 107*n*13, 107*n*20, 107*n*21, 107*n*22, 107*n*23, 107*n*30, 107*n*31, 107*n*32, and 107*n*33, respectively.

Reference numerals 110*n*00, 110*n*01, 110*n*02, 110*n*03, 110*n*10, 110*n*11, 110*n*12, 110*n*13, 110*n*20, 110*n*21, 110*n*22, 110*n*23, 110*n*30, 110*n*31, 110*n*32, and 110*n*33 denote contacts. The contact 110*n*00 connects the silicide layer 109*n*00 with the line 115*a*0 of the first metal compound wiring layer. The contact 110*n*01 connects the silicide layer 109*n*01 with the line 115*b*0 of the second metal compound wiring layer. The contact 110*n*02 connects the silicide layer 109*n*02 with the line 115*c*0 of the third metal compound wiringmetal compound wiring layer. The contact 110*n*03 connects the silicide layer 109*n*03 with the line 115*d*0 of the fourth metal compound wiringmetal compound wiring layer. The contact 110*n*10 connects the silicide layer 109*n*10 with the line 115*a*1 of the first metal compound wiringmetal compound wiring layer. The contact 110*n*11 connects the silicide layer 109*n*11 with the line 115*b*1 of the second metal compound wiringmetal compound wiring layer. The contact 110*n*12 connects the silicide layer 109*n*12 with the line 115*c*1 of the third metal compound wiringmetal compound wiring layer. The contact 110*n*13 connects the silicide layer 109*n*13 with the line 115*d*1 of the fourth metal compound wiringmetal compound wiring layer. The contact 110*n*20 connects the silicide layer 109*n*20 with the line 115*a*2 of the first metal compound wiringmetal compound wiring layer. The contact 110*n*21 connects the silicide layer 109*n*21 with the line 115*b*2 of the second metal compound wiringmetal compound wiring layer. The contact 110*n*22 connects the silicide layer 109*n*22 with the line 115*c*2 of the third metal compound wiringmetal compound wiring layer. The contact 110*n*23 connects the silicide layer 109*n*23 with the line 115*d*2 of the fourth metal compound wiringmetal compound wiring layer. The contact 110*n*30 connects the silicide layer 109*n*30 with the line 115*a*3 of the first metal compound wiringmetal compound wiring layer. The contact 110*n*31 connects the silicide layer 109*n*31 with the line 115*b*3 of the second metal compound wiring layer. The contact 110*n*32 connects the silicide layer 109*n*32 with the line 115*c*3 of the third metal compound wiring layer. The contact 110*n*33 connects the silicide layer 109*n*33 with the line 115*d*3 of the fourth metal compound wiring layer.

The silicon pillar 104*p*00, the lower diffusion layer 102*na*, the upper diffusion layer 107*n*00, the gate insulating film 105, and the gate electrode 106 constitute the NMOS transistor Tn00. The silicon pillar 104*p*01, the lower diffusion layer 102*nb*, the upper diffusion layer 107*n*01, the gate insulating film 105, and the gate electrode 106 constitute the NMOS transistor Tn01. The silicon pillar 104*p*02, the lower diffusion layer 102*nc*, the upper diffusion layer 107*n*02, the gate insulating film 105, and the gate electrode 106 constitute the NMOS transistor Tn02. The silicon pillar 104*p*03, the lower diffusion layer 102*nd*, the upper diffusion layer 107*n*03, the gate insulating film 105, and the gate electrode 106 constitute the NMOS transistor Tn03.

The silicon pillar 104*p*10, the lower diffusion layer 102*na*, the upper diffusion layer 107*n*10, the gate insulating film 105, and the gate electrode 106 constitute the NMOS transistor Tn10. The silicon pillar 104*p*11, the lower diffusion layer 102*nb*, the upper diffusion layer 107*n*11, the gate insulating film 105, and the gate electrode 106 constitute the NMOS transistor Tn11. The silicon pillar 104*p*12, the lower diffusion layer 102*nc*, the upper diffusion layer 107*n*12, the gate insulating film 105, and the gate electrode 106 constitute the NMOS transistor Tn12. The silicon pillar 104*p*13, the lower diffusion layer 102*nd*, the upper diffusion layer 107*n*13, the gate insulating film 105, and the gate electrode 106 constitute the NMOS transistor Tn13.

The silicon pillar 104*p*20, the lower diffusion layer 102*na*, the upper diffusion layer 107*n*20, the gate insulating film 105, and the gate electrode 106 constitute the NMOS transistor Tn20. The silicon pillar 104*p*21, the lower diffusion layer 102*nb*, the upper diffusion layer 107*n*21, the gate insulating film 105, and the gate electrode 106 constitute the NMOS transistor Tn21. The silicon pillar 104*p*22, the lower diffusion layer 102*nc*, the upper diffusion layer 107*n*22, the gate insulating film 105, and the gate electrode 106 constitute the NMOS transistor Tn22. The silicon pillar 104*p*23, the lower diffusion layer 102nd, the upper diffusion layer 107n23, the gate insulating film 105, and the gate electrode 106 constitute the NMOS transistor Tn23.

The silicon pillar 104p30, the lower diffusion layer 102na, the upper diffusion layer 107n30, the gate insulating film 105, and the gate electrode 106 constitute the NMOS transistor Tn30. The silicon pillar 104p31, the lower diffusion layer 102nb, the upper diffusion layer 107n31, the gate insulating film 105, and the gate electrode 106 constitute the NMOS transistor Tn31. The silicon pillar 104p32, the lower diffusion layer 102nc, the upper diffusion layer 107n32, the gate insulating film 105, and the gate electrode 106 constitute the NMOS transistor Tn32. The silicon pillar 104p33, the lower diffusion layer 102nd, the upper diffusion layer 107n33, the gate insulating film 105, and the gate electrode 106 constitute the NMOS transistor Tn33.

To the gate electrodes 106 of the NMOS transistors Tn00, Tn01, Tn02, and Tn03, the gate line 106a0 is connected. To the gate electrodes 106 of the NMOS transistors Tn10, Tn11, Tn12, and Tn13, the gate line 106a1 is connected. To the gate electrodes 106 of the NMOS transistors Tn20, Tn21, Tn22, and Tn23, the gate line 106a2 is connected. To the gate electrodes 106 of the NMOS transistors Tn30, Tn31, Tn32, and Tn33, the gate line 106a3 is connected.

The lower diffusion layer 102na serves as a common drain of the NMOS transistors Tn00, Tn10, Tn20, and Tn30 via the silicide layer 103, and the selection signal φ0 is fed to the lower diffusion layer 102na.

The lower diffusion layer 102nb serves as a common drain of the NMOS transistors Tn01, Tn11, Tn21, and Tn31 via the silicide layer 103, and the selection signal φ1 is fed to the lower diffusion layer 102nb.

The lower diffusion layer 102nc serves as a common drain of the NMOS transistors Tn02, Tn12, Tn22, and Tn32 via the silicide layer 103, and the selection signal φ2 is fed to the lower diffusion layer 102nc.

The lower diffusion layer 102nd serves as a common drain of the NMOS transistors Tn03, Tn13, Tn23, and Tn33 via the silicide layer 103, and the selection signal φ3 is fed to the lower diffusion layer 102nd.

According to this embodiment, by using SGTs, a decoder having a reduced area, which operates as follows, can be provided. That is, the selection signals φ0, φ1, φ2, and φ3 are respectively fed to the lower diffusion layers 102na, 102nb, 102nc, and 102nd that extend in the longitudinal direction. Any one set is selected from among the sets of lines 115a0 to 115d0, 115a1 to 115d1, 115a2 to 115d2, and 115a3 to 115d3, which are in the first to fourth metal compound wiring layers respectively, in accordance with any one signal selected from among the selection signals RD0 to RD3 of the row decoder, which is not illustrated, via the selection transistors Tn00 to Tn33, Tn10 to Tn13, Tn20 to Tn23, or Tn30 to Tn33, which are arranged in a matrix form.

Second Embodiment

Figure 3A:
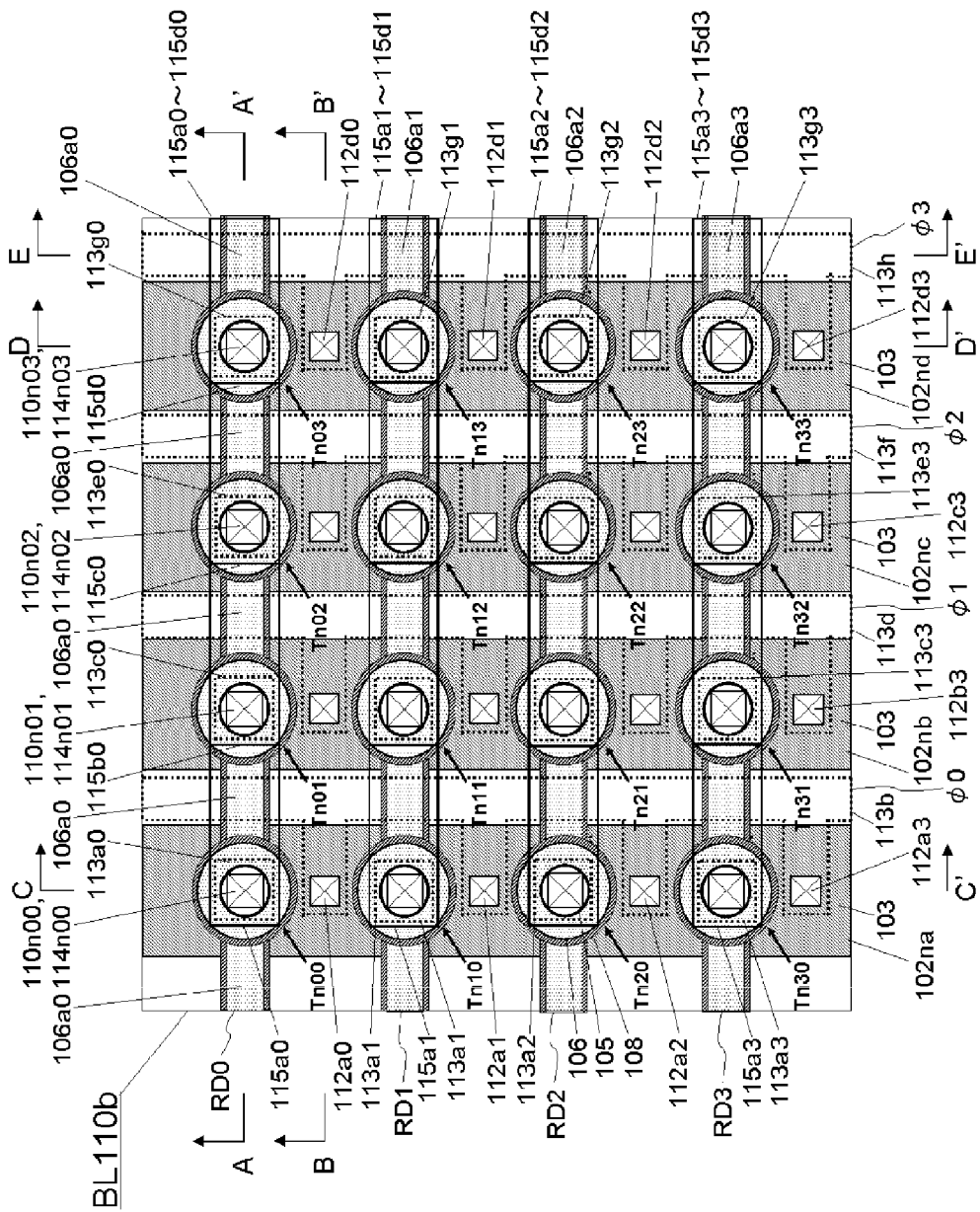
FIG. 3A is a plan view of a decoder according to a second embodiment of the present invention.
Figure 3B:
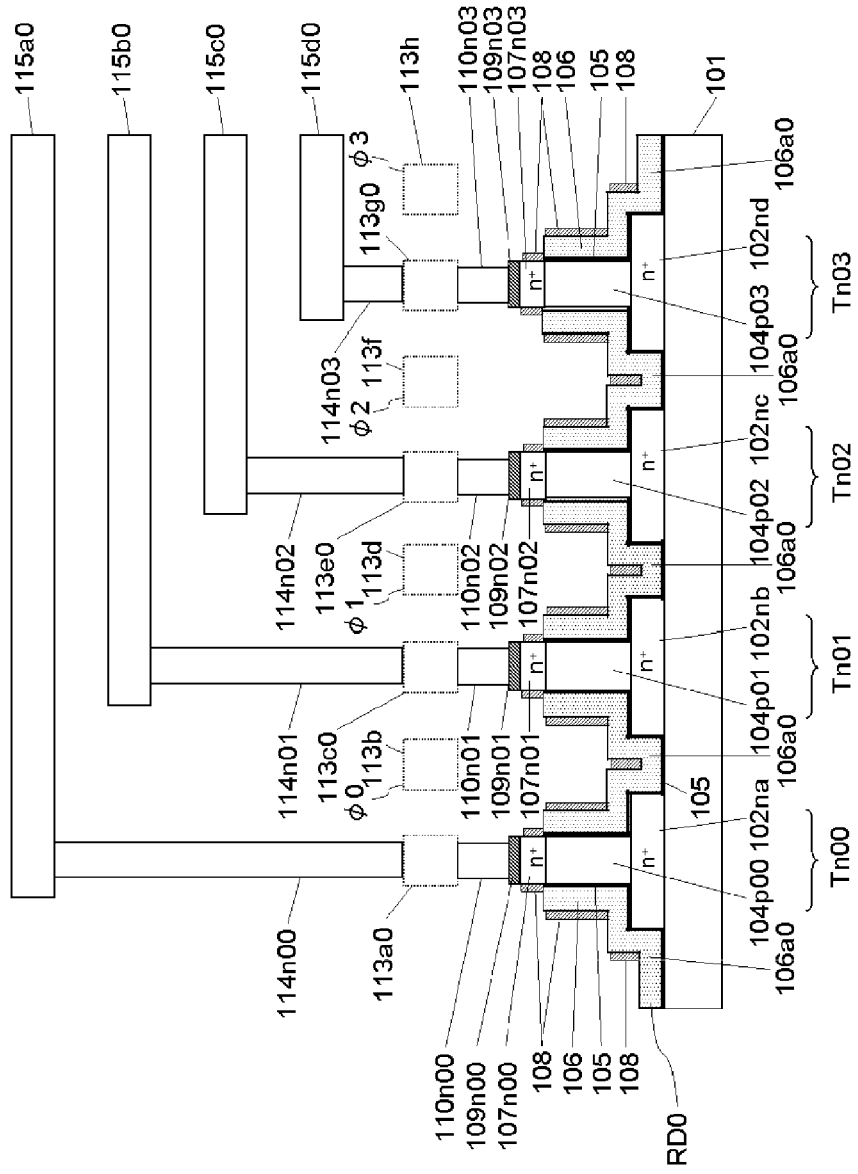
FIG. 3B is a cross-sectional view of the decoder according to the second embodiment of the present invention.
Figure 3C:
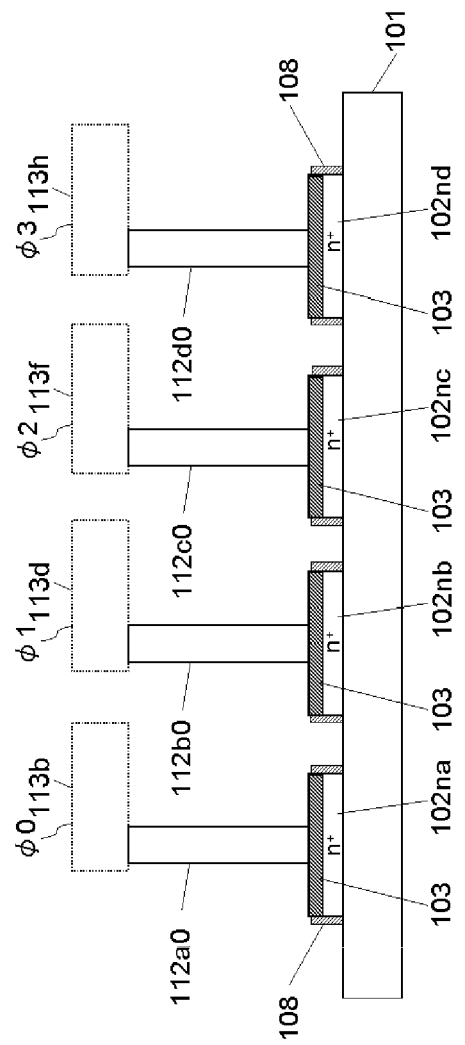
FIG. 3C is a cross-sectional view of the decoder according to the second embodiment of the present invention.
Figure 3D:
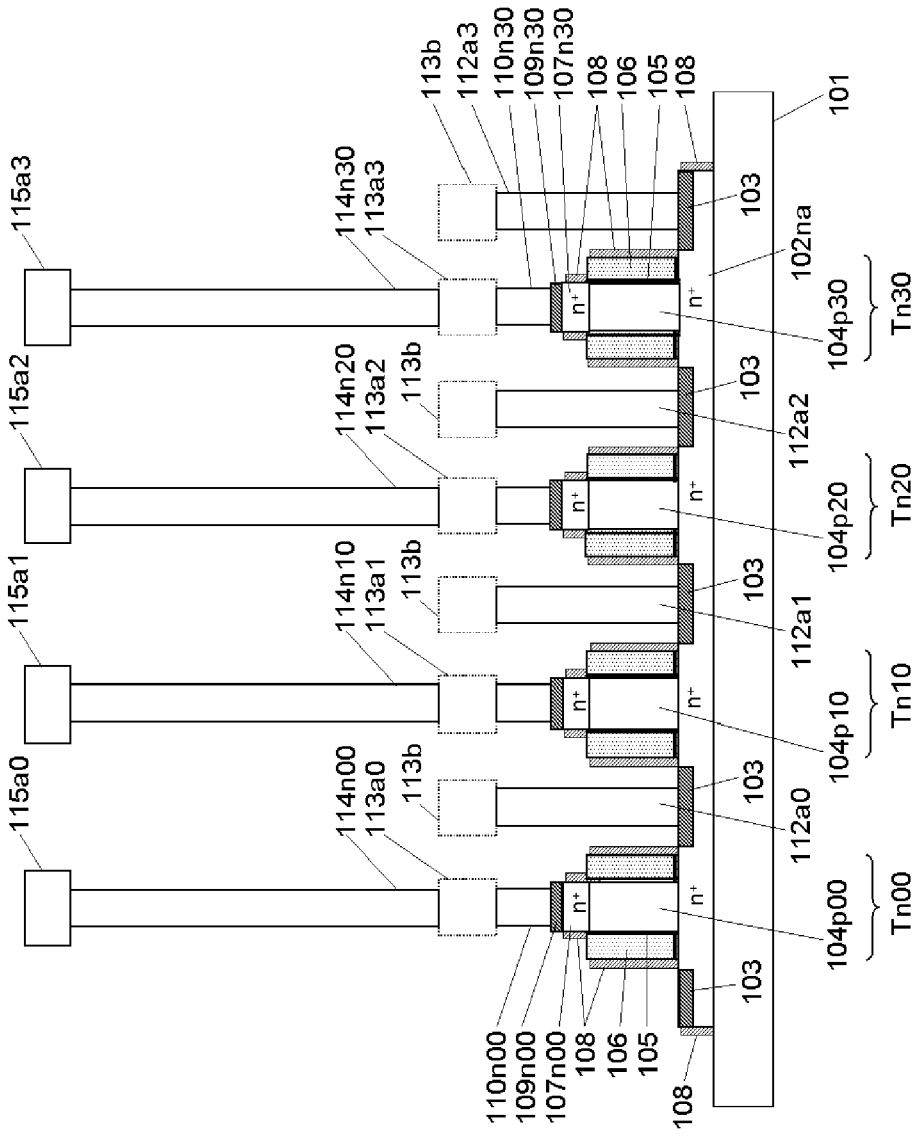
FIG. 3D is a cross-sectional view of the decoder according to the second embodiment of the present invention.
Figure 3E:
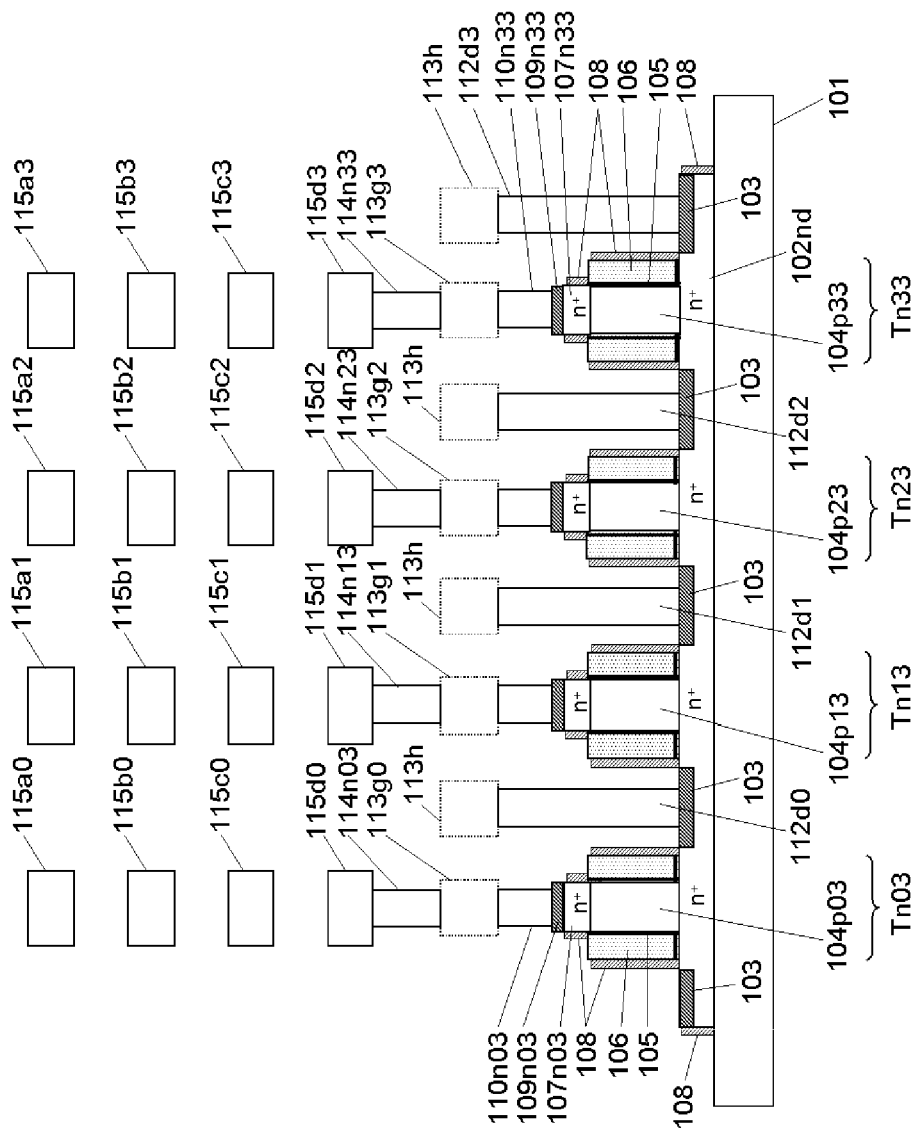
FIG. 3E is a cross-sectional view of the decoder according to the second embodiment of the present invention.

A second embodiment is illustrated in FIGS. 3A, 3B, 3C, 3D, 3E, and 3F. FIG. 3A is a plan view of a layout (arrangement) of a word line selection decoder according to this embodiment of the present invention. FIG. 3B is a cross-sectional view taken along cut line A-A' in FIG. 3A. FIG. 3C is a cross-sectional view taken along cut line B-B' in FIG. 3A. FIG. 3D is a cross-sectional view taken along cut line C-C' in FIG. 3A. FIG. 3E is a cross-sectional view taken along cut line D-D' in FIG. 3A. FIG. 3F is a cross-sectional view taken along cut line E-E' in FIG. 3A. An equivalent circuit in this embodiment is based on the memory element selection decoder 110 in FIG. 1.

FIGS. 3A to 3F are different from FIGS. 2A to 2F in that while only the lower diffusion layers 102na, 102nb, 102nc, and 102nd are used in wiring of the selection signal lines φ0 to φ3 in FIGS. 2A to 2F, wiring using a first metal wiring layer is employed, the first metal wiring layer being disposed in parallel with the lower diffusion layers, in FIGS. 3A to 3F, and therefore, the wiring resistance is reduced. Such a configuration is employed by taking into consideration the fact that the resistance of the lower diffusion layers is relatively high, and therefore, the parasitic resistance increases to a level that requires attention as the wiring length becomes longer.

In FIGS. 3A, 3B, 3C, 3D, 3E, and 3F, lines 113b, 113d, 113f, and 113h formed in the first metal wiring layer are provided below the lines 115d0 to 115d3 formed in the fourth metal compound wiring layer. The lines 113b, 113d, 113f, and 113h are disposed so as to extend along the lower diffusion layers 102na, 102nb, 102nc, and 102nd respectively, in the longitudinal direction (second direction) in FIG. 3A, and are connected to the lower diffusion layers at fixed intervals via contacts and silicide layers. The selection signals φ0 to φ3 are respectively fed to the lines 113b, 113d, 113f, and 113h in the first metal wiring layer, and therefore, the wiring resistance is reduced.

Note that, in FIGS. 3A, 3B, 3C, 3D, 3E, and 3F, a portion having the same structure as the corresponding one in FIGS. 2A, 2B, 2C, 2D, 2E, and 2F is denoted by a corresponding reference numeral in the one hundreds.

In FIGS. 3A, 3B, 3C, 3D, 3E, and 3F, the planar silicon layers 102na, 102nb, 102nc, and 102nd are formed on an insulating film, such as the BOX layer 101, formed on a substrate. The planar silicon layers 102na, 102nb, 102nc, and 102nd are respectively formed of $n^+$ diffusion layers formed by impurity implantation or the like. Reference numeral 103 denotes a silicide layer formed on the surface of each of the planar silicon layers 102na, 102nb, 102nc, and 102nd. Reference numerals 104p00, 104p01, 104p02, 104p03, 104p10, 104p11, 104p12, 104p13, 104p20, 104p21, 104p22, 104p23, 104p30, 104p31, 104p32, and 104p33 each denote a p-type silicon pillar. Reference numeral 105 denotes a gate insulating film that surrounds the silicon pillars 104p00, 104p01, 104p02, 104p03, 104p10, 104p11, 104p12, 104p13, 104p20, 104p21, 104p22, 104p23, 104p30, 104p31, 104p32, and 104p33. Reference numeral 106 denotes a gate electrode. Reference numerals 106a0, 106a1, 106a2, and 106a3 each denote a gate line. The gate insulating film 105 is also formed under the gate electrode 106 and the gate lines 106a0, 106a1, 106a2, and 106a3.

On the top portions of the silicon pillars 104p00, 104p01, 104p02, 104p03, 104p10, 104p11, 104p12, 104p13, 104p20, 104p21, 104p22, 104p23, 104p30, 104p31, 104p32, and 104p33, the $n^+$ diffusion layers 107n00, 107n01, 107n02, 107n03, 107n10, 107n11, 107n12, 107n13, 107n20, 107n21, 107n22, 107n23, 107n30, 107n31, 107n32, and 107n33 are respectively formed by impurity implantation or the like. Reference numeral 108 denotes a silicon-nitride film for protecting the gate insulating film 105. Reference numerals 109n00, 109n01, 109n02, 109n03, 109n10, 109n11, 109n12, 109n13, 109n20, 109n21, 109n22, 109n23, 109n30, 109n31, 109n32, and 109n33 denote silicide layers connected to the $n^+$ diffusion layers 107n00, 107n01, 107n02, 107n03, 107n10, 107n11, 107n12, 107n13, 107n20, 107n21, 107n22, 107n23, 107n30, 107n31, 107n32, and 107n33, respectively.

Reference numerals 110n00, 110n01, 110n02, 110n03, 110n10, 110n11, 110n12, 110n13, 110n20, 110n21, 110n22, 110$n$23, 110$n$30, 110$n$31, 110$n$32, and 110$n$33 denote contacts. The contact 110$n$00 connects the silicide layer 109$n$00 with the line 113$a$0 of the first metal wiring layer. The contact 110$n$01 connects the silicide layer 109$n$01 with the line 113$c$0 of the first metal wiring layer. The contact 110$n$02 connects the silicide layer 109$n$02 with the line 113$e$0 of the first metal wiring layer. The contact 110$n$03 connects the silicide layer 109$n$03 with the line 113$g$0 of the first metal wiring layer. The contact 110$n$10 connects the silicide layer 109$n$10 with the line 113$a$1 of the first metal wiring layer. The contact 110$n$11 connects the silicide layer 109$n$11 with the line 113$c$1 of the first metal wiring layer. The contact 110$n$12 connects the silicide layer 109$n$12 with the line 113$e$1 of the first metal wiring layer. The contact 110$n$13 connects the silicide layer 109$n$13 with the line 113$g$1 of the first metal wiring layer. The contact 110$n$20 connects the silicide layer 109$n$20 with the line 113$a$2 of the first metal wiring layer. The contact 110$n$21 connects the silicide layer 109$n$21 with the line 113$c$2 of the first metal wiring layer. The contact 110$n$22 connects the silicide layer 109$n$22 with the line 113$e$2 of the first metal wiring layer. The contact 110$n$23 connects the silicide layer 109$n$23 with the line 113$g$2 of the first metal wiring layer. The contact 110$n$30 connects the silicide layer 109$n$30 with the line 113$a$3 of the first metal wiring layer. The contact 110$n$31 connects the silicide layer 109$n$31 with the line 113$c$3 of the first metal wiring layer. The contact 110$n$32 connects the silicide layer 109$n$32 with the line 113$e$3 of the first metal wiring layer. The contact 110$n$33 connects the silicide layer 109$n$33 with the line 113$g$3 of the first metal wiring layer. Reference numerals 114$n$00, 114$n$01, 114$n$02, 114$n$03, 114$n$10, 114$n$11, 114$n$12, 114$n$13, 114$n$20, 114$n$21, 114$n$22, 114$n$23, 114$n$30, 114$n$31, 114$n$32, and 114$n$33 denote contacts. The contact 114$n$00 connects the line 113$a$0 of the first metal wiring layer with the line 115$a$0 of the first metal compound wiring layer connected to a word line. The contact 114$n$01 connects the line 113$c$0 of the first metal wiring layer with the line 115$b$0 of the second metal compound wiring layer connected to a word line. The contact 114$n$02 connects the line 113$e$0 of the first metal wiring layer with the line 115$c$0 of the third metal compound wiring layer connected to a word line. The contact 114$n$03 connects the line 113$g$0 of the first metal wiring layer with the line 115$d$0 of the fourth metal compound wiring layer connected to a word line. The contact 114$n$10 connects the line 113$a$1 of the first metal wiring layer with the line 115$a$1 of the first metal compound wiring layer connected to a word line. The contact 114$n$11 connects the line 113$c$1 of the first metal wiring layer with the line 115$b$1 of the second metal compound wiring layer connected to a word line. The contact 114$n$12 connects the line 113$e$1 of the first metal wiring layer with the line 115$c$1 of the third metal compound wiring layer connected to a word line. The contact 114$n$13 connects the line 113$g$1 of the first metal wiring layer with the line 115$d$1 of the fourth metal compound wiring layer connected to a word line. The contact 114$n$20 connects the line 113$a$2 of the first metal wiring layer with the line 115$a$2 of the first metal compound wiring layer connected to a word line. The contact 114$n$21 connects the line 113$c$2 of the first metal wiring layer with the line 115$b$2 of the second metal compound wiring layer connected to a word line. The contact 114$n$22 connects the line 113$e$2 of the first metal wiring layer with the line 115$c$2 of the third metal compound wiring layer connected to a word line. The contact 114$n$23 connects the line 113$g$2 of the first metal wiring layer with the line 115$d$2 of the fourth metal compound wiring layer connected to a word line. The contact 114$n$30 connects the line 113$a$3 of the first metal wiring layer with the line 115$a$3 of the first metal compound wiring layer connected to a word line. The contact 114$n$31 connects the line 113$c$3 of the first metal wiring layer with the line 115$b$3 of the second metal compound wiring layer connected to a word line. The contact 114$n$32 connects the line 113$e$3 of the first metal wiring layer with the line 115$c$3 of the third metal compound wiring layer connected to a word line. The contact 114$n$33 connects the line 113$g$3 of the first metal wiring layer with the line 115$d$3 of the fourth metal compound wiring layer connected to a word line.

Reference numerals 112$a$0, 112$a$1, 112$a$2, and 112$a$3 denote contacts that connect the line 113$b$ of the first metal wiring layer with the lower diffusion layer 102$na$ via the silicide layer 103. Reference numerals 112$b$0, 112$b$1, 112$b$2, and 112$b$3 denote contacts that connect the line 113$d$ of the first metal wiring layer with the lower diffusion layer 102$nb$ via the silicide layer 103. Reference numerals 112$c$0, 112$c$1, 112$c$2, and 112$c$3 denote contacts that connect the line 113$f$ of the first metal wiring layer with the lower diffusion layer 102$nc$ via the silicide layer 103. Reference numerals 112$d$0, 112$d$1, 112$d$2, and 112$d$3 denote contacts that connect the line 113$h$ of the first metal wiring layer with the lower diffusion layer 102$nd$ via the silicide layer 103.

The silicon pillar 104$p$00, the lower diffusion layer 102$na$, the upper diffusion layer 107$n$00, the gate insulating film 105, and the gate electrode 106 constitute the NMOS transistor Tn00. The silicon pillar 104$p$01, the lower diffusion layer 102$nb$, the upper diffusion layer 107$n$01, the gate insulating film 105, and the gate electrode 106 constitute the NMOS transistor Tn01. The silicon pillar 104$p$02, the lower diffusion layer 102$nc$, the upper diffusion layer 107$n$02, the gate insulating film 105, and the gate electrode 106 constitute the NMOS transistor Tn02. The silicon pillar 104$p$03, the lower diffusion layer 102$nd$, the upper diffusion layer 107$n$03, the gate insulating film 105, and the gate electrode 106 constitute the NMOS transistor Tn03.

The silicon pillar 104$p$10, the lower diffusion layer 102$na$, the upper diffusion layer 107$n$10, the gate insulating film 105, and the gate electrode 106 constitute the NMOS transistor Tn10. The silicon pillar 104$p$11, the lower diffusion layer 102$nb$, the upper diffusion layer 107$n$11, the gate insulating film 105, and the gate electrode 106 constitute the NMOS transistor Tn11. The silicon pillar 104$p$12, the lower diffusion layer 102$nc$, the upper diffusion layer 107$n$12, the gate insulating film 105, and the gate electrode 106 constitute the NMOS transistor Tn12. The silicon pillar 104$p$13, the lower diffusion layer 102$nd$, the upper diffusion layer 107$n$13, the gate insulating film 105, and the gate electrode 106 constitute the NMOS transistor Tn13.

The silicon pillar 104$p$20, the lower diffusion layer 102$na$, the upper diffusion layer 107$n$20, the gate insulating film 105, and the gate electrode 106 constitute the NMOS transistor Tn20. The silicon pillar 104$p$21, the lower diffusion layer 102$nb$, the upper diffusion layer 107$n$21, the gate insulating film 105, and the gate electrode 106 constitute the NMOS transistor Tn21. The silicon pillar 104$p$22, the lower diffusion layer 102$nc$, the upper diffusion layer 107$n$22, the gate insulating film 105, and the gate electrode 106 constitute the NMOS transistor Tn22. The silicon pillar 104$p$23, the lower diffusion layer 102$nd$, the upper diffusion layer 107$n$23, the gate insulating film 105, and the gate electrode 106 constitute the NMOS transistor Tn23.

The silicon pillar 104$p$30, the lower diffusion layer 102$na$, the upper diffusion layer 107$n$30, the gate insulating film 105, and the gate electrode 106 constitute the NMOS transistor Tn30. The silicon pillar 104$p$31, the lower diffusion layer 102$nb$, the upper diffusion layer 107$n$31, the gate insulating film 105, and the gate electrode 106 constitute the NMOS transistor Tn31. The silicon pillar 104p32, the lower diffusion layer 102nc, the upper diffusion layer 107n32, the gate insulating film 105, and the gate electrode 106 constitute the NMOS transistor Tn32. The silicon pillar 104p33, the lower diffusion layer 102nd, the upper diffusion layer 107n33, the gate insulating film 105, and the gate electrode 106 constitute the NMOS transistor Tn33.

To the gate electrodes 106 of the NMOS transistors Tn00, Tn01, Tn02, and Tn03, the gate line 106a0 is connected. To the gate electrodes 106 of the NMOS transistors Tn10, Tn11, Tn12, and Tn13, the gate line 106a1 is connected. To the gate electrodes 106 of the NMOS transistors Tn20, Tn21, Tn22, and Tn23, the gate line 106a2 is connected. To the gate electrodes 106 of the NMOS transistors Tn30, Tn31, Tn32, and Tn33, the gate line 106a3 is connected.

The lower diffusion layer 102na serves as a common drain of the NMOS transistors Tn00, Tn10, Tn20, and Tn30 via the silicide layer 103. The lower diffusion layer 102na is connected to the line 113b of the first metal wiring layer via the contacts 112a0, 112a1, 112a2, and 112a3, and the selection signal φ0 is fed to the line 113b.

The lower diffusion layer 102nb serves as a common drain of the NMOS transistors Tn01, Tn11, Tn21, and Tn31 via the silicide layer 103. The lower diffusion layer 102nb is connected to the line 113d of the first metal wiring layer via the contacts 112b0, 112b1, 112b2, and 112b3, and the selection signal φ1 is fed to the line 113d.

The lower diffusion layer 102nc serves as a common drain of the NMOS transistors Tn02, Tn12, Tn22, and Tn32 via the silicide layer 103. The lower diffusion layer 102nc is connected to the line 113f of the first metal wiring layer via the contacts 112c0, 112c1, 112c2, and 112c3, and the selection signal φ2 is fed to the line 113f.

The lower diffusion layer 102nd serves as a common drain of the NMOS transistors Tn03, Tn13, Tn23, and Tn33 via the silicide layer 103. The lower diffusion layer 102nd is connected to the line 113h of the first metal wiring layer via the contacts 112d0, 112d1, 112d2, and 112d3, and the selection signal φ3 is fed to the line 113h.

According to this embodiment, by using SGTs, a decoder having a reduced area, which operates as follows, can be provided. That is, the selection signals φ0, φ1, φ2, and φ3 are fed to the lower diffusion layers 102na, 102nb, 102nc, and 102nd that extend in the longitudinal direction via the contacts 112a0 to 112a3, the contacts 112b0 to 112b3, the contacts 112c0 to 112c3, and the contacts 112d0 to 112d3 respectively from the lines 113b, 113d, 113f, and 113h formed in the first metal wiring layer, which are also disposed so as to extend in the longitudinal direction. Any one set is selected from among the sets of lines 115a0 to 115d0, 115a1 to 115d1, 115a2 to 115d2, and 115a3 to 115d3 that are connected to word lines of memory elements, which are not illustrated, in accordance with any one signal selected from among the selection signals RD0 to RD3 of the row decoder, which is not illustrated, via the selection transistors Tn00 to Tn03, Tn10 to Tn13, Tn20 to Tn23, or Tn30 to Tn33 that are arranged in a matrix form.

Note that the lines 113a0, 113c0, 113e0, 113g0, 113a1, 113c1, 113e1, 113g1, 113a2, 113c2, 113e2, 113g2, 113a3, 113c3, 113e3, and 113g3 of the first metal wiring layer may be omitted, the line 113a0 being disposed between the upper source region of the selection transistor Tn00 and the line 115a0 of the first metal compound wiring layer, the line 113c0 being disposed between the upper source region of the selection transistor Tn01 and the line 115b0 of the second metal compound wiring layer, the line 113e0 being disposed between the upper source region of the selection transistor Tn02 and the line 115c0 of the third metal compound wiring layer, the line 113g0 being disposed between the upper source region of the selection transistor Tn03 and the line 115d0 of the fourth metal compound wiring layer, the line 113a1 being disposed between the upper source region of the selection transistor Tn10 and the line 115a1 of the first metal compound wiring layer, the line 113c1 being disposed between the upper source region of the selection transistor Tn11 and the line 115b1 of the second metal compound wiring layer, the line 113e1 being disposed between the upper source region of the selection transistor Tn12 and the line 115c1 of the third metal compound wiring layer, the line 113g1 being disposed between the upper source region of the selection transistor Tn13 and the line 115d1 of the fourth metal compound wiring layer, the line 113a2 being disposed between the upper source region of the selection transistor Tn20 and the line 115a2 of the first metal compound wiring layer, the line 113c2 being disposed between the upper source region of the selection transistor Tn21 and the line 115b2 of the second metal compound wiring layer, the line 113e2 being disposed between the upper source region of the selection transistor Tn22 and the line 115c2 of the third metal compound wiring layer, the line 113g2 being disposed between the upper source region of the selection transistor Tn23 and the line 115d2 of the fourth metal compound wiring layer, the line 113a3 being disposed between the upper source region of the selection transistor Tn30 and the line 115a3 of the first metal compound wiring layer, the line 113c3 being disposed between the upper source region of the selection transistor Tn31 and the line 115b3 of the second metal compound wiring layer, the line 113e3 being disposed between the upper source region of the selection transistor Tn32 and the line 115c3 of the third metal compound wiring layer, the line 113g3 being disposed between the upper source region of the selection transistor Tn33 and the line 115d3 of the fourth metal compound wiring layer. In this embodiment, the lines 113a0, 113c0, 113e0, 113g0, 113a1, 113c1, 113e1, 113g1, 113a2, 113c2, 113e2, 113g2, 113a3, 113c3, 113e3, and 113g3 of the first metal wiring layer are disposed in order to separate a process of manufacturing portions below the first metal wiring layer 113 and a process of manufacturing portions disposed above the first metal wiring layer 113, that is, the contacts 114 and subsequent portions.

That is, a process of manufacturing portions up to the first metal wiring layer 113 including the selection transistors Tn00 to Tn03, Tn10 to Tn13, Tn20 to Tn23, and Tn30 to Tn33 can be performed simultaneously with a process of manufacturing a logic circuit or the like to be disposed in other regions, which is not illustrated, thereby reducing an extra manufacturing process.

Third Embodiment

Figure 4A:
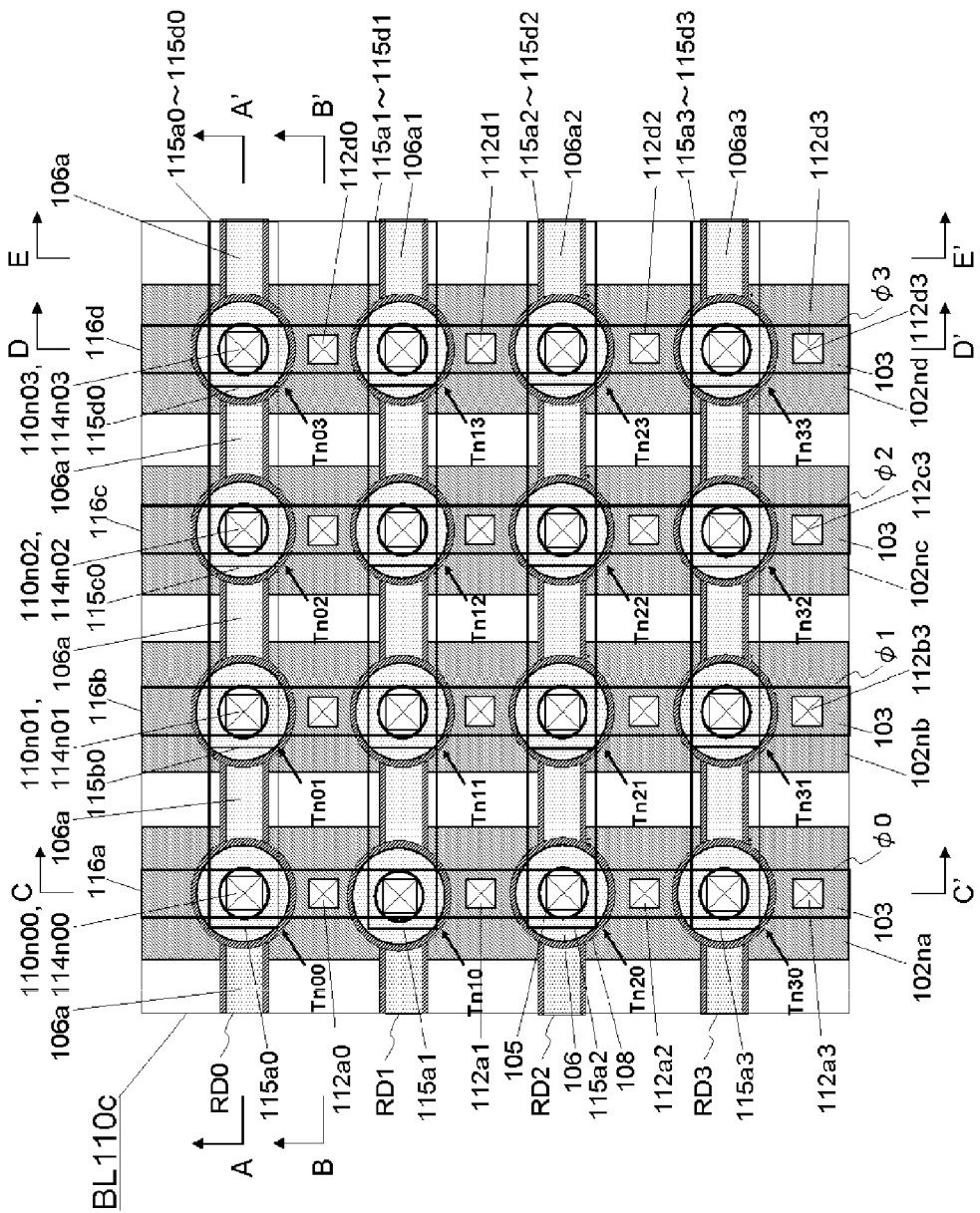
FIG. 4A is a plan view of a decoder according to a third embodiment of the present invention.
Figure 4B:
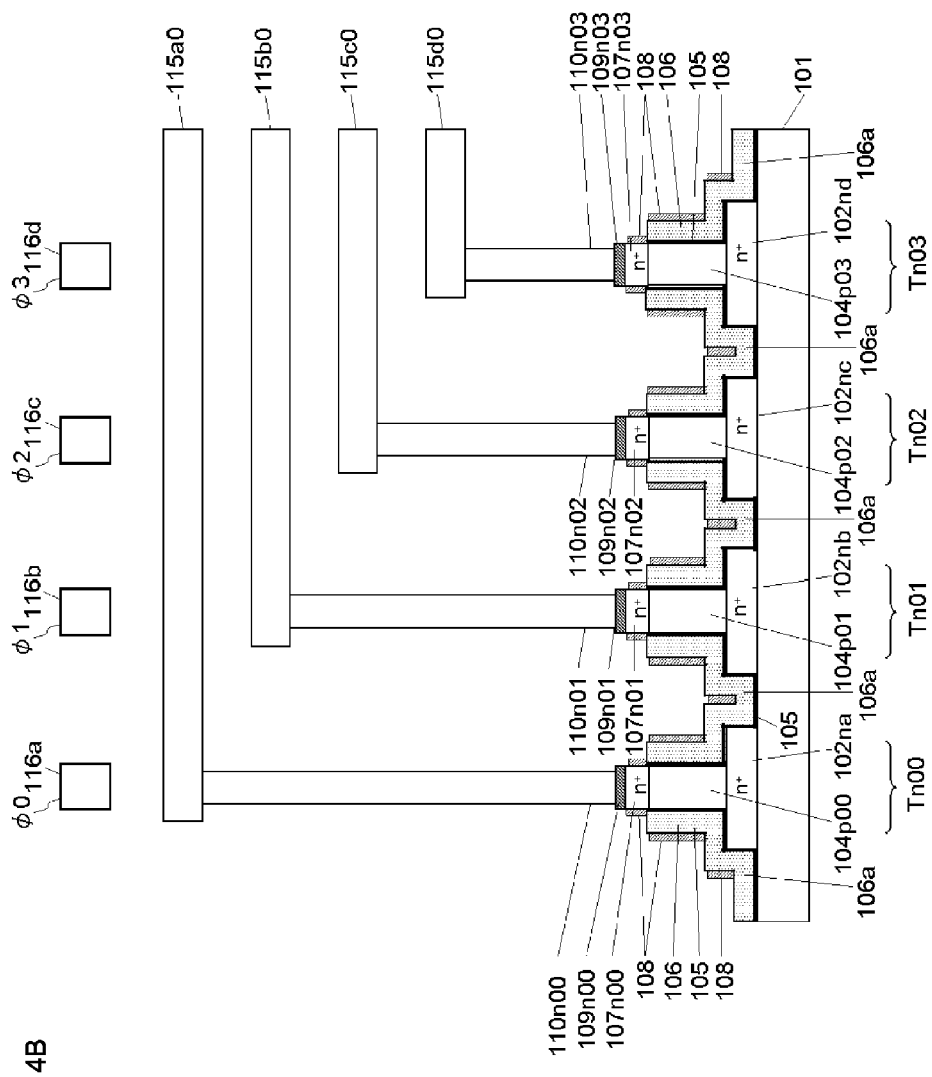
FIG. 4B is a cross-sectional view of the decoder according to the third embodiment of the present invention.
Figure 4C:
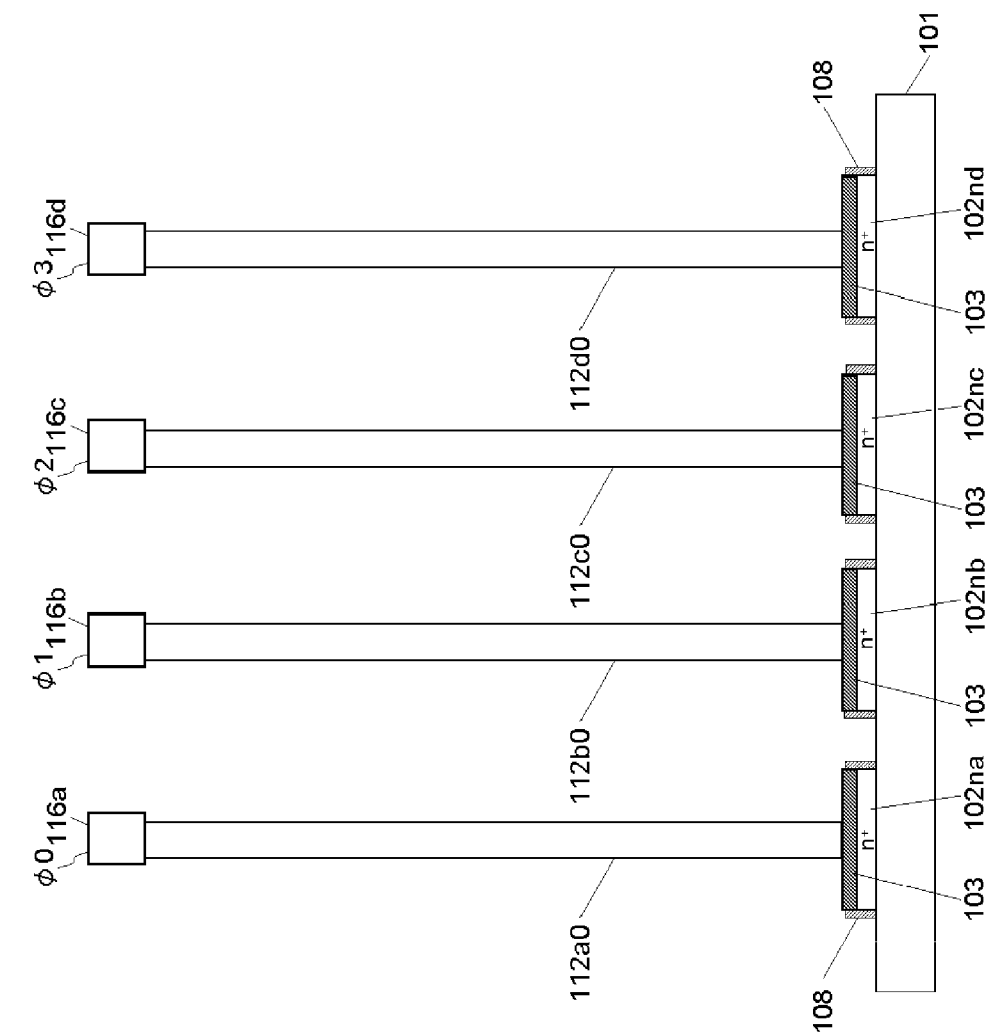
FIG. 4C is a cross-sectional view of the decoder according to the third embodiment of the present invention.
Figure 4D:
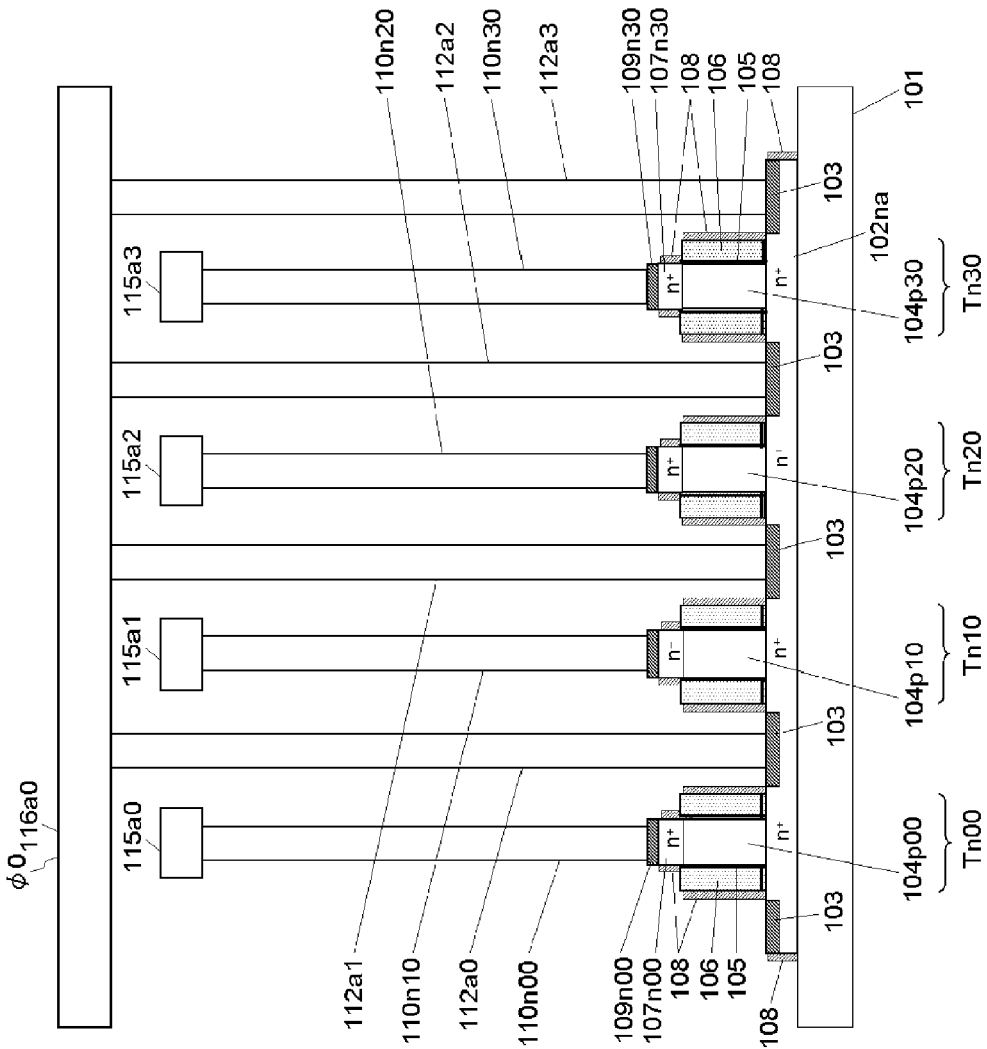
FIG. 4D is a cross-sectional view of the decoder according to the third embodiment of the present invention.
Figure 4E:
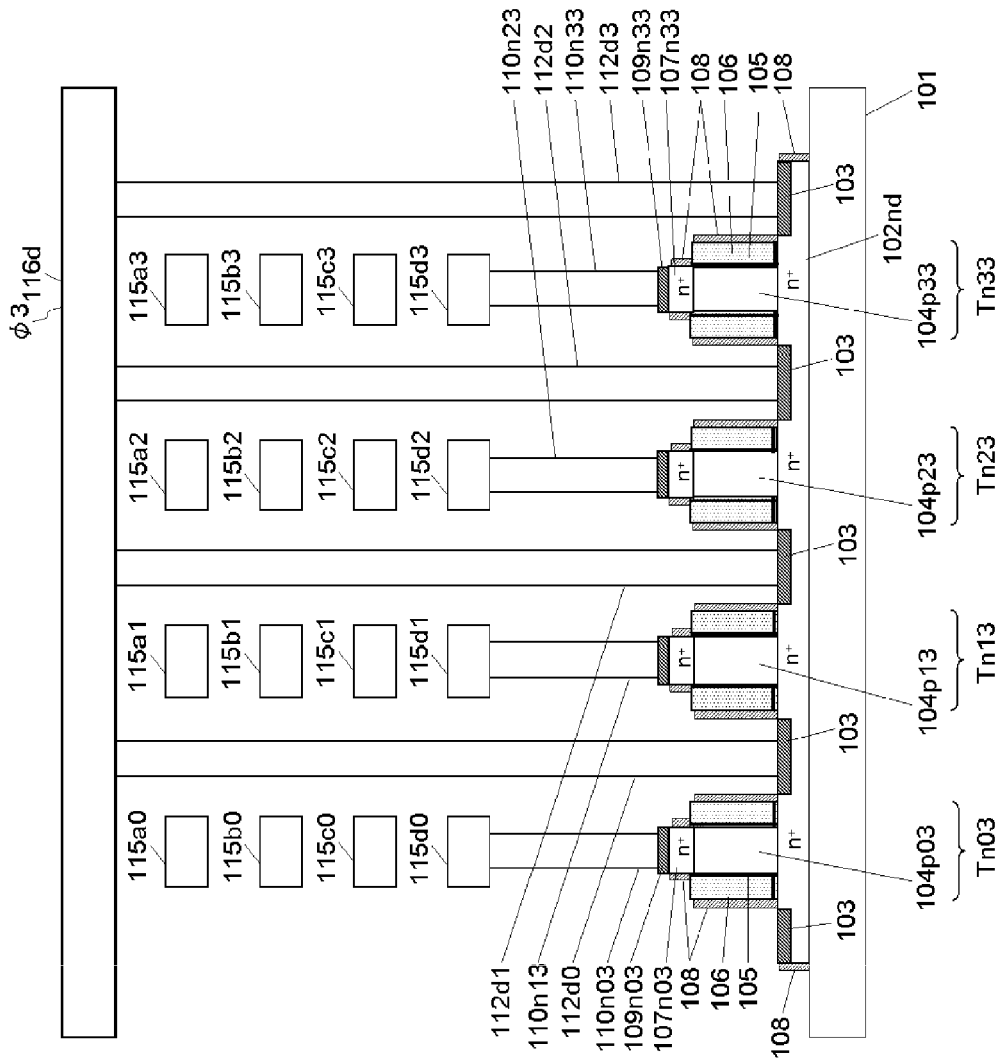
FIG. 4E is a cross-sectional view of the decoder according to the third embodiment of the present invention.
Figure 4F:
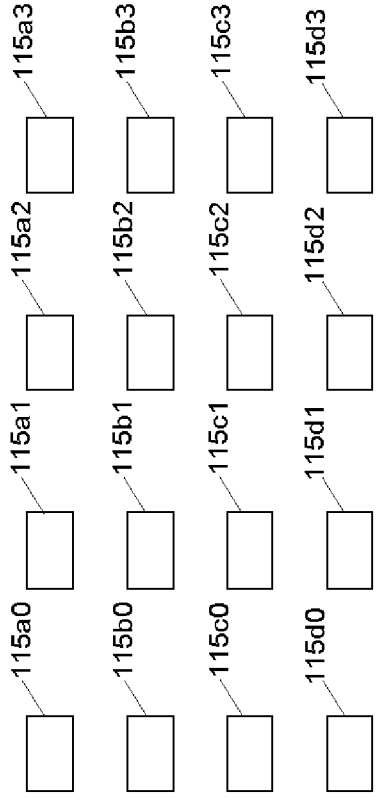
FIG. 4F is a cross-sectional view of the decoder according to the third embodiment of the present invention.
Figure 4F:
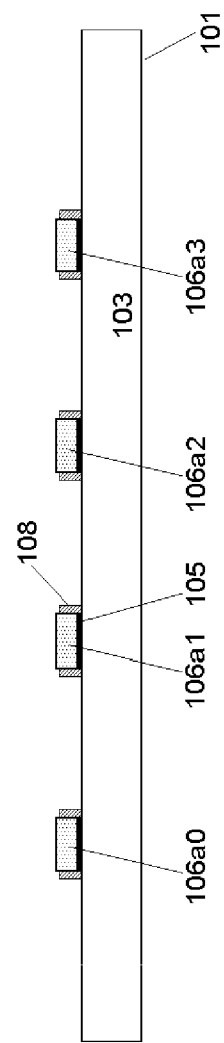

A third embodiment is illustrated in FIGS. 4A, 4B, 4C, 4D, 4E, and 4F. FIG. 4A is a plan view of a layout (arrangement) of a word line selection decoder according to this embodiment of the present invention. FIG. 4B is a cross-sectional view taken along cut line A-A' in FIG. 4A. FIG. 4C is a cross-sectional view taken along cut line B-B' in FIG. 4A. FIG. 4D is a cross-sectional view taken along cut line C-C' in FIG. 4A. FIG. 4E is a cross-sectional view taken along cut line D-D' in FIG. 4A. FIG. 4F is a cross-sectional view taken along cut line E-E' in FIG. 4A. An equivalent circuit in this embodiment is based on the memory element selection decoder 110 in FIG. 1.

FIGS. 4A to 4F are different from FIGS. 3A to 3F in that while the lines 113b, 113d, 113f, and 113h of the first metal wiring layer are used in wiring of the selection signal lines $\phi 0$ to $\phi 3$ in FIGS. 3A to 3F, lines 116$a$, 116$b$, 116$c$, and 116$d$ of the second metal wiring layer are used in wiring of the selection signal lines $\phi 0$ to $\phi 3$ in this embodiment.

While the lines 113$b$, 113$d$, 113$f$, and 113$h$ of the first metal wiring layer are disposed in a region below the fourth metal compound wiring layer, the lines 116$a$, 116$b$, 116$c$, and 116$d$ of the second metal wiring layer are disposed in a region above the first metal compound wiring layer.

Such a configuration is employed in order to use the same metal wiring layer in which the bit line BLk of the SGT-NAND string not illustrated are formed, which will be described below.

In FIGS. 4A, 4B, 4C, 4D, 4E, and 4F, the lines 116$a$, 116$b$, 116$c$, and 116$d$ formed in the second metal wiring layer are provided above the lines 115$a$0 to 115$a$3 formed in the first metal compound wiring layer. The lines 116$a$, 116$b$, 116$c$, and 116$d$ are disposed so as to extend along the lower diffusion layers 102$na$, 102$nb$, 102$nc$, and 102$nd$ respectively, in the longitudinal direction (second direction) in FIG. 4A, and are connected to the lower diffusion layers at fixed intervals via contacts and silicide layers. The selection signals $\phi 0$ to $\phi 3$ are respectively fed to the lines 116$a$, 116$b$, 116$c$, and 116$d$ of the second metal wiring layer, and therefore, the wiring resistance is reduced.

Note that, in FIGS. 4A, 4B, 4C, 4D, 4E, and 4F, a portion having the same structure as the corresponding one in FIGS. 3A, 3B, 3C, 3D, 3E, and 3F is denoted by a corresponding reference numeral in the one hundreds.

In FIGS. 4A, 4B, 4C, 4D, 4E, and 4F, the planar silicon layers 102$na$, 102$nb$, 102$nc$, and 102$nd$ are formed on an insulating film, such as the BOX layer 101, formed on a substrate. The planar silicon layers 102$na$, 102$nb$, 102$nc$, and 102$nd$ are respectively formed of n$^+$ diffusion layers formed by impurity implantation or the like. Reference numeral 103 denotes a silicide layer formed on the surface of each of the planar silicon layers 102$na$, 102$nb$, 102$nc$, and 102$nd$. Reference numerals 104$p$00, 104$p$01, 104$p$02, 104$p$03, 104$p$10, 104$p$11, 104$p$12, 104$p$13, 104$p$20, 104$p$21, 104$p$22, 104$p$23, 104$p$30, 104$p$31, 104$p$32, and 104$p$33 each denote a p-type silicon pillar. Reference numeral 105 denotes a gate insulating film that surrounds the silicon pillars 104$p$00, 104$p$01, 104$p$02, 104$p$03, 104$p$10, 104$p$11, 104$p$12, 104$p$13, 104$p$20, 104$p$21, 104$p$22, 104$p$23, 104$p$30, 104$p$31, 104$p$32, and 104$p$33. Reference numeral 106 denotes a gate electrode. Reference numerals 106$a$0, 106$a$1, 106$a$2, and 106$a$3 each denote a gate line. The gate insulating film 105 is also formed under the gate electrode 106 and the gate lines 106$a$0, 106$a$1, 106$a$2, and 106$a$3.

On the top portions of the silicon pillars 104$p$00, 104$p$01, 104$p$02, 104$p$03, 104$p$10, 104$p$11, 104$p$12, 104$p$13, 104$p$20, 104$p$21, 104$p$22, 104$p$23, 104$p$30, 104$p$31, 104$p$32, and 104$p$33, the n$^+$ diffusion layers 107$n$00, 107$n$01, 107$n$02, 107$n$03, 107$n$10, 107$n$11, 107$n$12, 107$n$13, 107$n$20, 107$n$21, 107$n$22, 107$n$23, 107$n$30, 107$n$31, 107$n$32, and 107$n$33 are respectively formed by impurity implantation or the like. Reference numeral 108 denotes a silicon-nitride film for protecting the gate insulating film 105. Reference numerals 109$n$00, 109$n$01, 109$n$02, 109$n$03, 109$n$10, 109$n$11, 109$n$12, 109$n$13, 109$n$20, 109$n$21, 109$n$22, 109$n$23, 109$n$30, 109$n$31, 109$n$32, and 109$n$33 denote silicide layers connected to the n$^+$ diffusion layers 107$n$00, 107$n$01, 107$n$02, 107$n$03, 107$n$10, 107$n$11, 107$n$12, 107$n$13, 107$n$20, 107$n$21, 107$n$22, 107$n$23, 107$n$30, 107$n$31, 107$n$32, and 107$n$33, respectively.

Reference numerals 110$n$00, 110$n$01, 110$n$02, 110$n$03, 110$n$10, 110$n$11, 110$n$12, 110$n$13, 110$n$20, 110$n$21, 110$n$22, 110$n$23, 110$n$30, 110$n$31, 110$n$32, and 110$n$33 denote contacts. The contact 110$n$00 connects the silicide layer 109$n$00 with the line 115$a$0 of the first metal compound wiring layer connected to a word line. The contact 110$n$01 connects the silicide layer 109$n$01 with the line 115$b$0 of the second metal compound wiring layer connected to a word line. The contact 110$n$02 connects the silicide layer 109$n$02 with the line 115$c$0 of the third metal compound wiring layer connected to a word line. The contact 110$n$03 connects the silicide layer 109$n$03 with the line 115$d$0 of the fourth metal compound wiring layer connected to a word line. The contact 110$n$10 connects the silicide layer 109$n$10 with the line 115$a$1 of the first metal compound wiring layer connected to a word line. The contact 110$n$11 connects the silicide layer 109$n$11 with the line 115$b$1 of the second metal compound wiring layer connected to a word line. The contact 110$n$12 connects the silicide layer 109$n$12 with the line 115$c$1 of the third metal compound wiring layer connected to a word line. The contact 110$n$13 connects the silicide layer 109$n$13 with the line 115$d$1 of the fourth metal compound wiring layer connected to a word line. The contact 110$n$20 connects the silicide layer 109$n$20 with the line 115$a$2 of the first metal compound wiring layer connected to a word line. The contact 110$n$21 connects the silicide layer 109$n$21 with the line 115$b$2 of the second metal compound wiring layer connected to a word line. The contact 110$n$22 connects the silicide layer 109$n$22 with the line 115$c$2 of the third metal compound wiring layer connected to a word line. The contact 110$n$23 connects the silicide layer 109$n$23 with the line 115$d$2 of the fourth metal compound wiring layer connected to a word line. The contact 110$n$30 connects the silicide layer 109$n$30 with the line 115$a$3 of the first metal compound wiring layer connected to a word line. The contact 110$n$31 connects the silicide layer 109$n$31 with the line 115$b$3 of the second metal compound wiring layer connected to a word line. The contact 110$n$32 connects the silicide layer 109$n$32 with the line 115$c$3 of the third metal compound wiring layer connected to a word line. The contact 110$n$33 connects the silicide layer 109$n$33 with the line 115$d$3 of the fourth metal compound wiring layer connected to a word line.

Reference numerals 112$a$0, 112$a$1, 112$a$2, and 112$a$3 denote contacts that connect the line 116$a$ of the second metal wiring layer with the lower diffusion layer 102$na$ via the silicide layer 103. Reference numerals 112$b$0, 112$b$1, 112$b$2, and 112$b$3 denote contacts that connect the line 116$b$ of the second metal wiring layer with the lower diffusion layer 102$nb$ via the silicide layer 103. Reference numerals 112$c$0, 112$c$1, 112$c$2, and 112$c$3 denote contacts that connect the line 116$c$ of the second metal wiring layer with the lower diffusion layer 102$nc$ via the silicide layer 103. Reference numerals 112$d$0, 112$d$1, 112$d$2, and 112$d$3 denote contacts that connect the line 116$d$ of the second metal wiring layer with the lower diffusion layer 102$nd$ via the silicide layer 103.

The silicon pillar 104$p$00, the lower diffusion layer 102$na$, the upper diffusion layer 107$n$00, the gate insulating film 105, and the gate electrode 106 constitute the NMOS transistor Tn00. The silicon pillar 104$p$01, the lower diffusion layer 102$nb$, the upper diffusion layer 107$n$01, the gate insulating film 105, and the gate electrode 106 constitute the NMOS transistor Tn01. The silicon pillar 104$p$02, the lower diffusion layer 102$nc$, the upper diffusion layer 107$n$02, the gate insulating film 105, and the gate electrode 106 constitute the NMOS transistor Tn02. The silicon pillar 104$p$03, the lower diffusion layer 102$nd$, the upper diffusion layer 107$n$03, the gate insulating film 105, and the gate electrode 106 constitute the NMOS transistor Tn03.

The silicon pillar 104$p$10, the lower diffusion layer 102$na$, the upper diffusion layer 107$n$10, the gate insulating film 105, and the gate electrode 106 constitute the NMOS transistor Tn10. The silicon pillar 104p11, the lower diffusion layer 102nb, the upper diffusion layer 107n11, the gate insulating film 105, and the gate electrode 106 constitute the NMOS transistor Tn11. The silicon pillar 104p12, the lower diffusion layer 102nc, the upper diffusion layer 107n12, the gate insulating film 105, and the gate electrode 106 constitute the NMOS transistor Tn12. The silicon pillar 104p13, the lower diffusion layer 102nd, the upper diffusion layer 107n13, the gate insulating film 105, and the gate electrode 106 constitute the NMOS transistor Tn13.

The silicon pillar 104p20, the lower diffusion layer 102na, the upper diffusion layer 107n20, the gate insulating film 105, and the gate electrode 106 constitute the NMOS transistor Tn20. The silicon pillar 104p21, the lower diffusion layer 102nb, the upper diffusion layer 107n21, the gate insulating film 105, and the gate electrode 106 constitute the NMOS transistor Tn21. The silicon pillar 104p22, the lower diffusion layer 102nc, the upper diffusion layer 107n22, the gate insulating film 105, and the gate electrode 106 constitute the NMOS transistor Tn22. The silicon pillar 104p23, the lower diffusion layer 102nd, the upper diffusion layer 107n23, the gate insulating film 105, and the gate electrode 106 constitute the NMOS transistor Tn23.

The silicon pillar 104p30, the lower diffusion layer 102na, the upper diffusion layer 107n30, the gate insulating film 105, and the gate electrode 106 constitute the NMOS transistor Tn30. The silicon pillar 104p31, the lower diffusion layer 102nb, the upper diffusion layer 107n31, the gate insulating film 105, and the gate electrode 106 constitute the NMOS transistor Tn31. The silicon pillar 104p32, the lower diffusion layer 102nc, the upper diffusion layer 107n32, the gate insulating film 105, and the gate electrode 106 constitute the NMOS transistor Tn32. The silicon pillar 104p33, the lower diffusion layer 102nd, the upper diffusion layer 107n33, the gate insulating film 105, and the gate electrode 106 constitute the NMOS transistor Tn33.

To the gate electrodes 106 of the NMOS transistors Tn00, Tn01, Tn02, and Tn03, the gate line 106a0 is connected. To the gate electrodes 106 of the NMOS transistors Tn10, Tn11, Tn12, and Tn13, the gate line 106a1 is connected. To the gate electrodes 106 of the NMOS transistors Tn20, Tn21, Tn22, and Tn23, the gate line 106a2 is connected. To the gate electrodes 106 of the NMOS transistors Tn30, Tn31, Tn32, and Tn33, the gate line 106a3 is connected.

The lower diffusion layer 102na serves as a common drain of the NMOS transistors Tn00, Tn10, Tn20, and Tn30 via the silicide layer 103. The lower diffusion layer 102na is connected to the line 116a of the second metal wiring layer via the contacts 112a0, 112a1, 112a2, and 112a3, and the selection signal φ0 is fed to the line 116a.

The lower diffusion layer 102nb serves as a common drain of the NMOS transistors Tn01, Tn11, Tn21, and Tn31 via the silicide layer 103. The lower diffusion layer 102nb is connected to the line 116b of the second metal wiring layer via the contacts 112b0, 112b1, 112b2, and 112b3, and the selection signal φ1 is fed to the line 116b.

The lower diffusion layer 102nc serves as a common drain of the NMOS transistors Tn02, Tn12, Tn22, and Tn32 via the silicide layer 103. The lower diffusion layer 102nc is connected to the line 116c of the second metal wiring layer via the contacts 112c0, 112c1, 112c2, and 112c3, and the selection signal φ2 is fed to the line 116c.

The lower diffusion layer 102nd serves as a common drain of the NMOS transistors Tn03, Tn13, Tn23, and Tn33 via the silicide layer 103. The lower diffusion layer 102nd is connected to the line 116d of the second metal wiring layer via the contacts 112d0, 112d1, 112d2, and 112d3, and the selection signal φ3 is fed to the line 116d.

According to this embodiment, by using SGTs, a decoder having a reduced area, which operates as follows, can be provided. That is, the selection signals φ0, φ1, φ2, and φ3 are fed to the lower diffusion layers 102na, 102nb, 102nc, and 102nd that extend in the longitudinal direction via the contacts 112a0 to 112a3, the contacts 112b0 to 112b3, the contacts 112c0 to 112c3, and the contacts 112d0 to 112d3 respectively from the lines 116a, 116b, 116c, and 116d of the second metal wiring layer, which are also disposed so as to extend in the longitudinal direction. Any one set is selected from among the sets of lines 115a0 to 115d0, 115a1 to 115d1, 115a2 to 115d2, and 115a3 to 115d3 that are connected to word lines of memory elements, which are not illustrated, in accordance with any one signal selected from among the selection signals RD0 to RD3 of the row decoder, which is not illustrated, via the selection transistors Tn00 to Tn03, Tn10 to Tn13, Tn20 to Tn23, or Tn30 to Tn33 that are arranged in a matrix form.

Furthermore, the lines 116a, 116b, 116c, and 116d formed in the second metal wiring layer for feeding selection signals are formed by using the same wiring layer in which the bit line of memory cells, which are not illustrated, is formed to thereby simplify the manufacturing process.

Fourth Embodiment

Figure 5A:
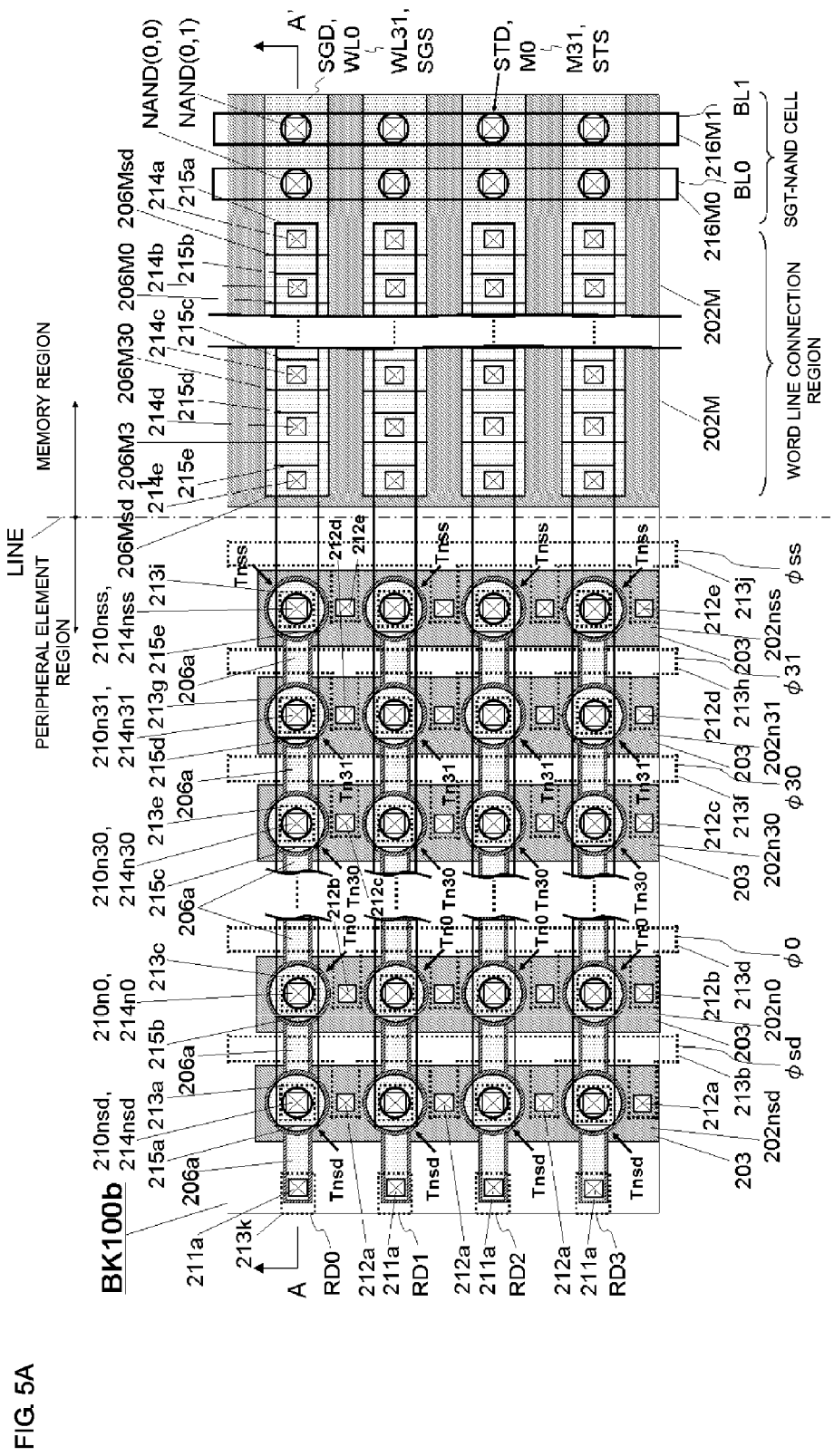
FIG. 5A is a plan view of a decoder according to a fourth embodiment of the present invention.
Figure 5B:
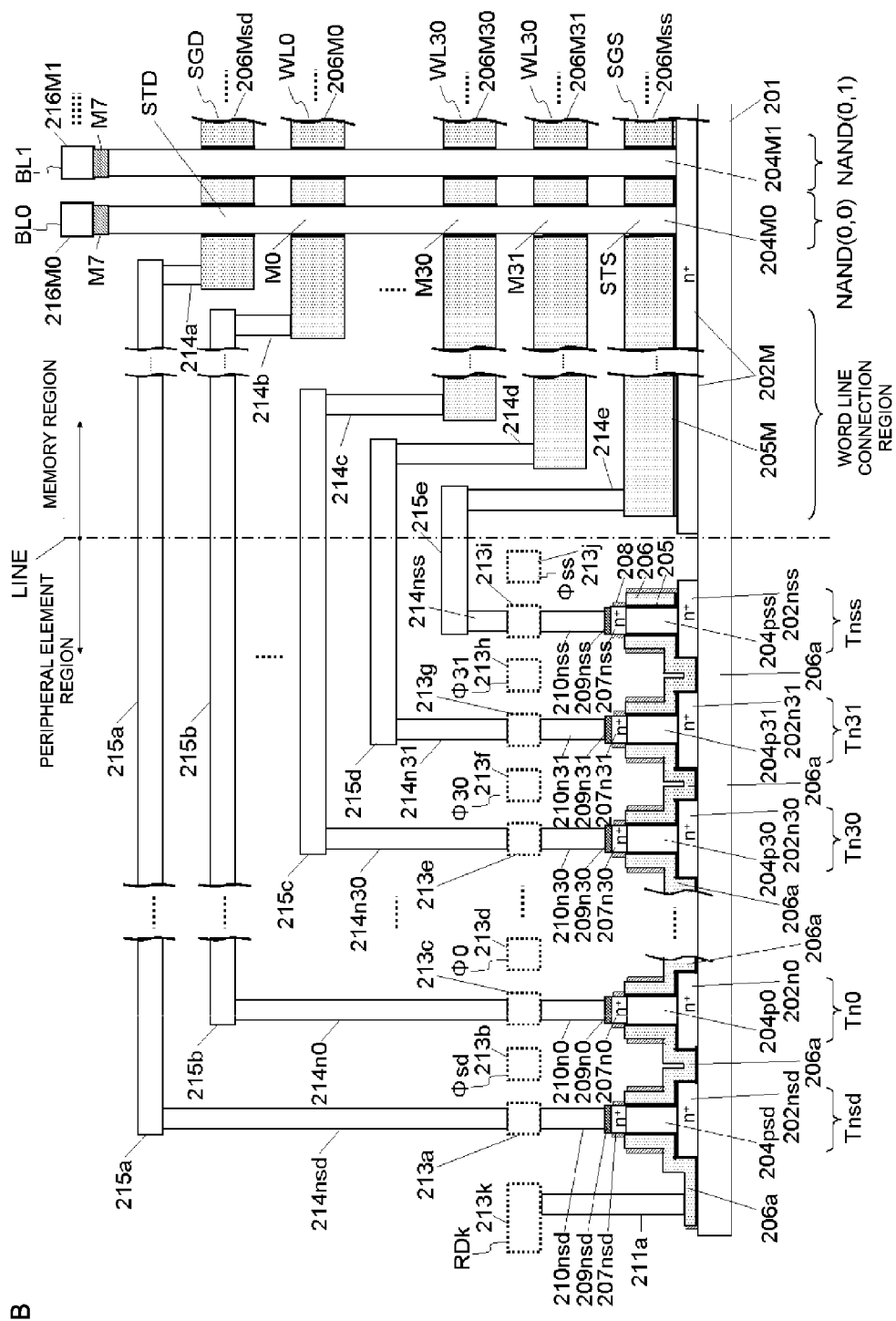
FIG. 5B is a cross-sectional view of the decoder according to the fourth embodiment of the present invention.

A fourth embodiment is illustrated in FIGS. 5A and 5B. FIG. 5A is a plan view of a layout (arrangement) of a word line selection decoder according to this embodiment of the present invention. FIG. 5B is a cross-sectional view taken along cut line A-A' in FIG. 5A. An equivalent circuit in this embodiment is based on the NAND string selection decoder 100 in FIG. 1. In FIGS. 5A and 5B, BL110b illustrated in the second embodiment (FIGS. 3A to 3F) is employed as the memory element selection decoder 110.

Note that cross-sectional views taken along the longitudinal direction in FIG. 5A are the same as FIGS. 3D, 3E, and 3F, which are cross-sectional views taken along the longitudinal direction in FIG. 3A, and therefore, the cross-sectional views taken along the longitudinal direction in FIG. 5A will be omitted here.

FIGS. 5A and 5B illustrate a configuration that includes SGT-NAND strings as illustrated in the NAND string selection decoder 100 in FIG. 1. That is, eight NAND strings NAND(j, k) (j=0 to 3, k=0 and 1) are arranged in a matrix form, and each NAND string NAND(j, k) includes the drain selection transistor STD, the memory elements M0 to M31, and the source selection transistor STS, that is, 34 elements in total, which are vertically stacked and disposed in order in series.

In FIG. 5A, NAND(0, 0) and NAND(0, 1) are disposed in the top row laterally from the left side. The gate electrodes of the drain selection transistor STD, the memory elements M0 to M31, and the source selection transistor STS, that is, total of 34 elements, which are connected in series, of each of NAND(0, 0) and NAND(0, 1) are connected as follows. That is, the gate electrodes of the drain selection transistors STD of NAND(0, 0) and NAND(0, 1) are connected with each other by a gate line 206Msd that extends in the lateral direction (the first direction, also referred to as the row direction) in FIG. 5A. The gate electrodes of the memory elements M0 to M31 of NAND(0, 0) and NAND(0, 1) are connected with each other by gate lines 206M0 to 206M31 that extend in the lateral direction, respectively. The gate electrodes of the source selection transistors STS of NAND(0, 0) and NAND(0, 1) are connected with each other by a gate line 206Mss that extends in the lateral direction.

Similarly, NAND(1, 0) and NAND(1, 1) are disposed in the second row laterally from the left side. NAND(2, 0) and NAND(2, 1) are disposed in the third row, and NAND(3, 0) and NAND(3, 1) are disposed in the fourth row.

The drains of the drain selection transistors STD of NAND (0, 0), NAND(1, 0), NAND(2, 0), and NAND(3, 0) are connected to a bit line BL0 that is disposed so as to extend in the longitudinal direction (second direction) in FIG. 5A. The drains of the drain selection transistors STD of NAND(0, 1), NAND(1, 1), NAND(2, 1), and NAND(3, 1) are connected to a bit line BL1 that is disposed so as to extend in the longitudinal direction (second direction).

The sources of the source selection transistors STS of NAND(0, 0), NAND(1, 0), NAND(2, 0), NAND(3, 0), NAND(0, 1), NAND(1, 1), NAND(2, 1), and NAND(3, 1) are all connected to a lower diffusion layer 202M that serves as a source line.

Note that, in FIGS. 5A and 5B, a portion having the same structure as the corresponding one in FIGS. 3A, 3B, 3C, 3D, 3E, and 3F is denoted by a corresponding reference numeral in the two hundreds.

As illustrated in FIG. 5B, contacts 214a, 214b, 214c, 214d, and 214e are newly provided for connection. The contact 214a is provided in order to connect a first metal compound wiring layer 215a with the gate line 206Msd for the drain selection transistors STD of the NAND strings NAND(0, 0) and NAND(0, 1). The contact 214b is provided in order to connect a second metal compound wiring layer 215b with the gate line 206M0 for the memory elements M0 of the NAND strings NAND(0, 0) and NAND(0, 1). The contact 214c is provided in order to connect a 32nd metal compound wiring layer 215c with the gate line 206M30 for the memory elements M30 of the NAND strings NAND(0, 0) and NAND(0, 1). The contact 214d is provided in order to connect a 33rd metal compound wiring layer 215d with the gate line 206M31 for the memory elements M31 of the NAND strings NAND (0, 0) and NAND(0, 1). The contact 214e is provided in order to connect a 34th metal compound wiring layer 215e with the gate line 206Mss for the source selection transistors STS of the NAND strings NAND(0, 0) and NAND(0, 1). The first metal compound wiring layer 215a, the second metal compound wiring layer 215b, the 32nd metal compound wiring layer 215c, the 33rd metal compound wiring layer 215d, and the 34th metal compound wiring layer 215e correspond to the first to fourth metal compound wiring layers 115a, 115b, 115c, and 115d illustrated in the first to third embodiments. The drain selection transistor STD, the memory elements M0 to M31, and the source selection transistor STS are vertically stacked in each of the NAND strings NAND(0, 0) and NAND (0, 1).

Description will be given by referring to FIG. 5A and FIG. 5B, which is a cross-sectional view taken along cut line A-A' in FIG. 5A. Planar silicon layers 202nsd, 202n0, ..., 202n30, 202n31, and 202nss are formed on an insulating film, such as a BOX layer 201, formed on a substrate. The planar silicon layers 202nsd, 202n0, ..., 202n30, 202n31, and 202nss are respectively formed of n$^+$ diffusion layers formed by impurity implantation or the like. Reference numeral 203 denotes a silicide layer formed on the surface of each of the planar silicon layers 202nsd, 202n0, ..., 202n30, 202n31, and 202nss.

Reference numerals 204psd, 204p0, ..., 204p30, 204p31, and 204pss each denote a p-type silicon pillar. Reference numeral 205 denotes a gate insulating film that surrounds the silicon pillars 204psd, 204p0, ..., 204p30, 204p31, and 204pss. Reference numeral 206 denotes a gate electrode. Reference numeral 206a denotes a gate line. The gate insulating film 205 is also formed under the gate electrode 206 and the gate line 206a.

On the top portions of the silicon pillars 204psd, 204p0, ..., 204p30, 204p31, and 204pss, n$^+$ diffusion layers 207nsd, 207n0, ..., 207n30, 207n31, and 207nss are formed by impurity implantation or the like. Reference numeral 208 denotes a silicon-nitride film for protecting the gate insulating film 205. Reference numerals 209nsd, 209n0, ..., 209n30, 209n31, and 209nss denote silicide layers connected to the n$^+$ diffusion layers 207nsd, 207n0, ..., 207n30, 207n31, and 207nss, respectively.

Reference numerals 210nsd, 210n0, ..., 210n30, 210n31, and 210nss denote contacts. The contact 210nsd connects the silicide layer 209nsd with a line 213a of the first metal wiring layer. The contact 210n0 connects the silicide layer 209n0 with a line 213c of the first metal wiring layer. The contact 210n30 connects the silicide layer 210n30 with a line 213e of the first metal wiring layer. The contact 210n31 connects the silicide layer 210n31 with a line 213g of the first metal wiring layer. The contact 210nss connects the silicide layer 209nss with a line 213i of the first metal wiring layer. Reference numerals 214nsd, 214n0, ..., 214n30, 214n31, and 214nss denote contacts. The contact 214nsd connects the line 213a of the first metal wiring layer with a line 215a of the first metal compound wiring layer. The contact 214n0 connects the line 213c of the first metal wiring layer with a line 215b of the second metal compound wiring layer. The contact 214n30 connects the line 213e of the first metal wiring layer with a line 215c of the 32nd metal compound wiring layer. The contact 214n31 connects the line 213g of the first metal wiring layer with a line 215d of the 33rd metal compound wiring layer. The contact 214nss connects the line 213i of the first metal wiring layer with a line 215e of the 34th metal compound wiring layer. The lines 215a, 215b, 215c, 215d, and 215e are respectively connected to the gate lines 206Msd, 206M0, ..., 206M30, 206M31, and 206Mss for the vertically-stacked transistors of the NAND strings.

Reference numeral 212a denotes a contact that connects a line 213b of the first metal wiring layer with the lower diffusion layer 202nsd via the silicide layer 203. Reference numeral 212b denotes a contact that connects a line 213d of the first metal wiring layer with the lower diffusion layer 202n0 via the silicide layer 203. Reference numeral 212c denotes a contact that connects a line 213f of the first metal wiring layer with the lower diffusion layer 202n30 via the silicide layer 203. Reference numeral 212d denotes a contact that connects a line 213h of the first metal wiring layer with the lower diffusion layer 202n31 via the silicide layer 203. Reference numeral 212e denotes a contact that connects a line 213j of the first metal wiring layer with the lower diffusion layer 202nss via the silicide layer 203.

The silicon pillar 204psd, the lower diffusion layer 202nsd, the upper diffusion layer 207nsd, the gate insulating film 205, and the gate electrode 206 constitute the NMOS transistor Tnsd. The silicon pillar 204p0, the lower diffusion layer 202n0, the upper diffusion layer 207n0, the gate insulating film 205, and the gate electrode 206 constitute the NMOS transistor Tn0. The silicon pillar 204p30, the lower diffusion layer 202n30, the upper diffusion layer 207n30, the gate insulating film 205, and the gate electrode 206 constitute the NMOS transistor Tn30. The silicon pillar 204p31, the lower diffusion layer 202n31, the upper diffusion layer 207n31, the gate insulating film 205, and the gate electrode 206 constitute the NMOS transistor Tn31. The silicon pillar 204pss, the lower diffusion layer 202*nss*, the upper diffusion layer 207*nss*, the gate insulating film 205, and the gate electrode 206 constitute the NMOS transistor Tnss.

To the gate electrodes 206 of the NMOS transistors Tnsd, Tn0, . . . , Tn30, Tn31, and Tnss, the gate line 206*a* is connected.

The lower diffusion layer 202*nsd* serves as a common drain of the NMOS transistors Tnsd (four transistors are disposed in the longitudinal direction in FIG. 5A) via the silicide layer 203. The lower diffusion layer 202*nsd* is connected to the line 213*b* of the first metal wiring layer via the contacts 212*a* (four contacts are disposed in the longitudinal direction in FIG. 5A), and the selection signal φsd is fed to the line 213*b*.

The lower diffusion layer 202*n*0 serves as a common drain of the NMOS transistors Tn0 (four transistors are disposed in the longitudinal direction in FIG. 5A) via the silicide layer 203. The lower diffusion layer 202*n*0 is connected to the line 213*d* of the first metal wiring layer via the contacts 212*b* (four contacts are disposed in the longitudinal direction in FIG. 5A), and the selection signal φ0 is fed to the line 213*d*.

The lower diffusion layer 202*n*30 serves as a common drain of the NMOS transistors Tn30 (four transistors are disposed in the longitudinal direction in FIG. 5A) via the silicide layer 203. The lower diffusion layer 202*n*30 is connected to the line 213*f* of the first metal wiring layer via the contacts 212*c* (four contacts are disposed in the longitudinal direction in FIG. 5A), and the selection signal φ30 is fed to the line 213*f*.

The lower diffusion layer 202*n*31 serves as a common drain of the NMOS transistors Tn31 (four transistors are disposed in the longitudinal direction in FIG. 5A) via the silicide layer 203. The lower diffusion layer 202*n*31 is connected to the line 213*h* of the first metal wiring layer via the contacts 212*d* (four contacts are disposed in the longitudinal direction in FIG. 5A), and the selection signal φ31 is fed to the line 213*h*.

The lower diffusion layer 202*nss* serves as a common drain of the NMOS transistors Tnss (four transistors are disposed in the longitudinal direction in FIG. 5A) via the silicide layer 203. The lower diffusion layer 202*nss* is connected to the line 213*j* of the first metal wiring layer via the contacts 212*e* (four contacts are disposed in the longitudinal direction in FIG. 5A), and the selection signal φss is fed to the line 213*j*.

The upper diffusion layer 207*nsd* that serves as the source of the NMOS transistor Tnsd is connected to the gate line 206Msd that is a common gate line for the drain selection transistors STD of the NAND strings NAND(0, 0) and NAND (0, 1) via the contact 210*nsd*, the line 213*a* of the first metal wiring layer, the contact 214*nsd*, the line 215*a* of the first metal compound wiring layer, and the contact 214*a*.

The upper diffusion layer 207*n*0 that serves as the source of the NMOS transistor Tn0 is connected to the gate line 206M0 that is a common gate line for the memory elements M0 of the NAND strings NAND(0, 0) and NAND(0, 1) via the contact 210*n*0, the line 213*c* of the first metal wiring layer, the contact 214*n*0, the line 215*b* of the first metal compound wiring layer, and the contact 214*b*.

The upper diffusion layer 207*n*30 that serves as the source of the NMOS transistor Tn30 is connected to the gate line 206M30 that is a common gate line for the memory elements M30 of the NAND strings NAND(0, 0) and NAND(0, 1) via the contact 210*n*30, the line 213*e* of the first metal wiring layer, the contact 214*n*30, the line 215*c* of the 32nd metal compound wiring layer, and the contact 214*c*.

The upper diffusion layer 207*n*31 that serves as the source of the NMOS transistor Tn31 is connected to the gate line 206M31 that is a common gate line for the memory elements M31 of the NAND strings NAND(0, 0) and NAND(0, 1) via the contact 210*n*31, the line 213*g* of the first metal wiring layer, the contact 214*n*31, the line 215*d* of the 33rd metal compound wiring layer, and the contact 214*d*.

The upper diffusion layer 207*nss* that serves as the source of the NMOS transistor Tnss is connected to the gate line 206Mss that is a common gate line for the source selection transistors STS of the NAND strings NAND(0, 0) and NAND (0, 1) via the contact 210*nss*, the line 213*i* of the first metal wiring layer, the contact 214*nss*, the line 215*e* of the 34th metal compound wiring layer, and the contact 214*e*.

The gate line 206*a* is connected to a line 213*k* of the first metal wiring layer via a contact 211*a*, and RD0 output from the row selection decoders 200*j* and 300*j*, which are not illustrated, is fed to the line 213*k*.

Although the same reference numerals are used, a similar configuration is employed for RD1 to RD3 output from the row selection decoders.

According to this embodiment, by using SGTs, a decoder having a reduced area, which operates as follows, can be provided. That is, the selection signals φsd, φ0, . . . , φ30, φ31, and φss are fed to the lower diffusion layers 202*nsd*, 202*n*0, . . . , 202*n*30, 202*n*31, and 202*nss* that extend in the longitudinal direction via the contacts 212*a*, 212*b*, 212*c*, 212*d*, and 212*e* respectively from the lines 213*b*, 213*d*, 213*f*, 213*h*, and 213*j* formed in the first metal wiring layer, which are also disposed so as to extend in the longitudinal direction. Selection from among the first metal compound wiring layer 215*a*, the second metal compound wiring layer 215*b*, the 32nd metal compound wiring layer 215*c*, the 33rd metal compound wiring layer 215*d*, and the 34th metal compound wiring layer 215*e* is made, which are respectively connected to the gate electrodes of the selection transistors STD, the memory elements M0, the memory elements M30, the memory elements M31, and the selection transistors STS of the NAND strings NAND(j, k) (j=0 to 3, k=0 and 1), in accordance with any one signal selected from among the selection signals RD0 to RD3 of the row decoder, which is not illustrated, via the selection transistors Tnsd, Tn0, Tn30, Tn31, and Tnss that are arranged in a matrix form.

As described in the second embodiment, by using the lines of the first metal wiring layer as metal lines for the decoder in this embodiment, manufacturing relating to the peripheral element region on the left side of FIG. 5B can be performed in the same manufacturing process as other peripheral circuit devices, which are not illustrated. As a result, a complex manufacturing process is not necessary.

That is, a process of manufacturing portions up to the first metal wiring layer 213 including the selection transistors Tnsd, Tn0, Tn30, Tn31, and Tnss can be performed simultaneously with a process of manufacturing a logic circuit or the like to be disposed in other regions, which is not illustrated, thereby reducing an extra manufacturing process.

Fifth Embodiment

Figure 6A:
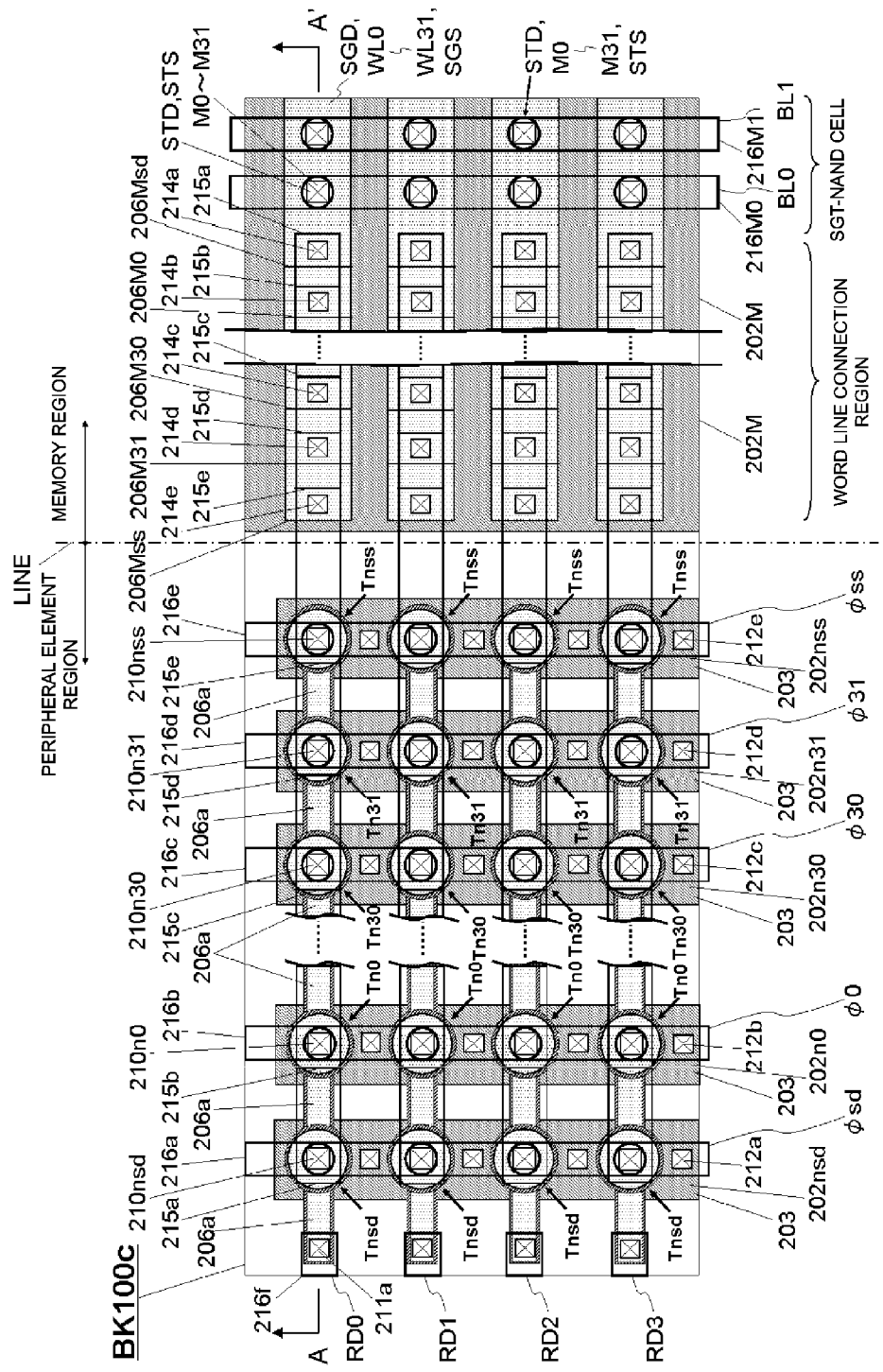
FIG. 6A is a plan view of a decoder according to a fifth embodiment of the present invention.
Figure 6B:
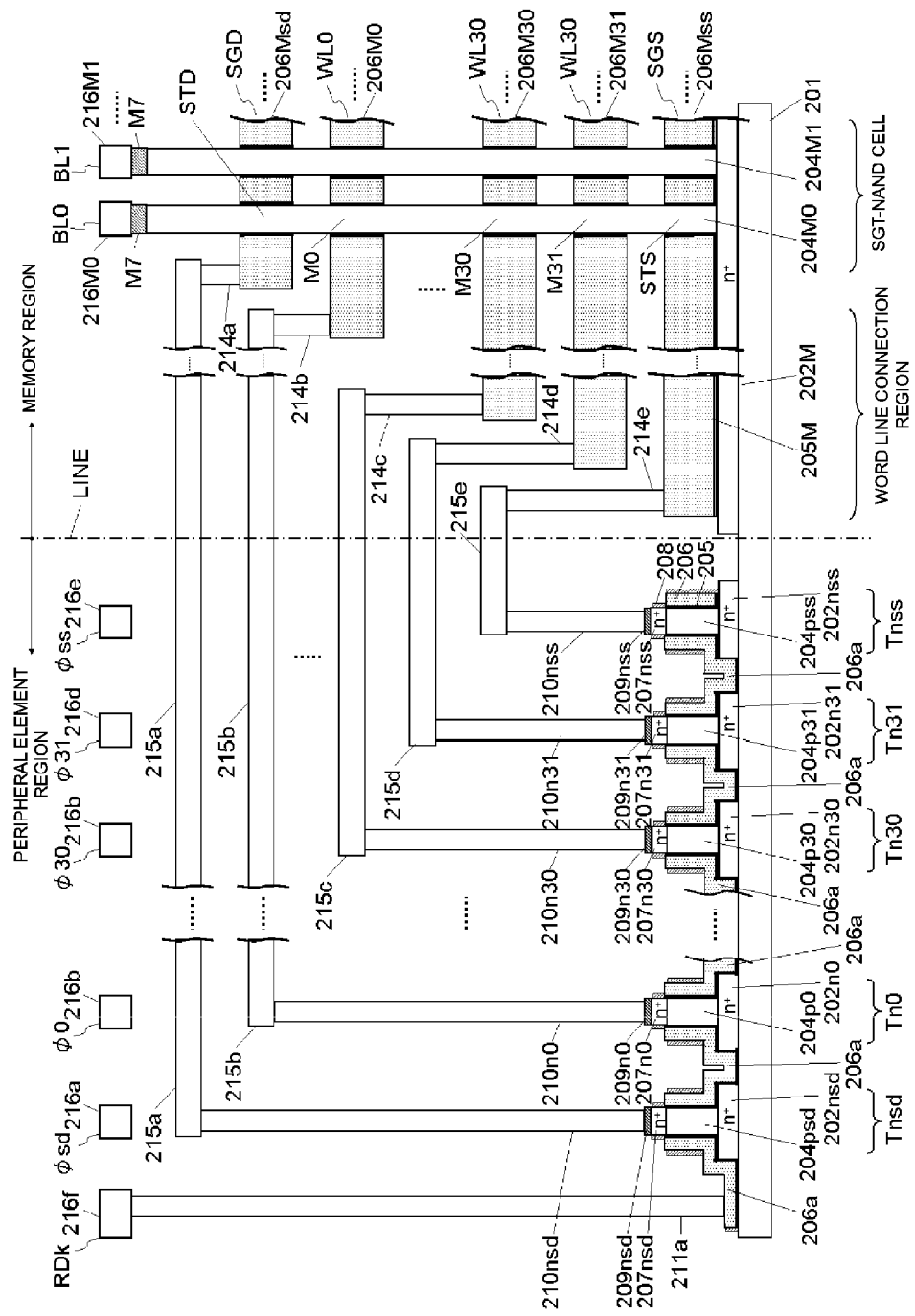
FIG. 6B is a cross-sectional view of the decoder according to the fifth embodiment of the present invention.

A fifth embodiment is illustrated in FIGS. 6A and 6B. FIG. 6A is a plan view of a layout (arrangement) of a word line selection decoder according to this embodiment of the present invention. FIG. 6B is a cross-sectional view taken along cut line A-A' in FIG. 6A. An equivalent circuit in this embodiment is based on the NAND string selection decoder 100 in FIG. 1. In FIGS. 6A and 6B, BL110*c* illustrated in the third embodiment (FIGS. 4A to 4F) is employed as the memory element selection decoder 110.

Note that cross-sectional views taken along the longitudinal direction in FIG. 6A are the same as FIGS. 4D, 4E, and 4F, which are cross-sectional views taken along the longitudinal direction in FIG. 4A, and therefore, the cross-sectional views taken along the longitudinal direction in FIG. 6A will be omitted here.

FIGS. 6A and 6B illustrate a configuration that includes SGT-NAND strings as illustrated in the NAND string selection decoder 100 in FIG. 1. That is, eight NAND strings NAND(j, k) (j=0 to 3, k=0 and 1) are arranged in a matrix form, and each NAND string NAND(j, k) includes the drain selection transistor STD, the memory elements M0 to M31, and the source selection transistor STS, that is, 34 elements in total, which are vertically stacked and disposed in order in series.

Note that the configuration of the NAND strings is the same as that illustrated in FIGS. 5A and 5B, and therefore, detailed description will be omitted.

In FIGS. 6A and 6B, a portion having the same structure as the corresponding one in FIGS. 4A, 4B, 4C, 4D, 4E, 4F, 5A, and 5B is denoted by a corresponding reference numeral in the two hundreds.

A difference between FIGS. 6A and 6B and FIGS. 5A and 5B is similar to the difference between FIGS. 3A to 3F and FIGS. 4A to 4F. That is, while the second selection signal lines φsd, φ0, φ30, φ31, and φss are formed in the first metal wiring layer and are disposed below the line 215e of the 34th metal compound wiring layer in FIGS. 5A and 5B, the second selection signal lines φsd, φ0, φ30, φ31, and φss are formed in the second metal wiring layer and are disposed above the line 215a of the first metal compound wiring layer in FIGS. 6A and 6B. The reason for such a configuration has been as described above. The second selection signal lines φsd, φ0, φ30, φ31, and φss are formed as lines of the second metal wiring layer, that is, lines in the same metal wiring layer in which bit lines 216M0 and 216M1 of the NAND strings are formed to thereby simplify the manufacturing process.

However, the contact 211a that connects a line 216f of the second metal wiring layer to which an output row selection signal RDj of a row decoder is fed and the gate line 206a has the maximum height (depth). Therefore, it is necessary to pay attention in a case of creating this contact.

According to this embodiment, by using SGTs, a decoder having a reduced area, which operates as follows, can be provided. That is, the selection signals φsd, φ0, . . . , φ30, φ31, and φss are fed to the lower diffusion layers 202nsd, 202n0, . . . , 202n30, 202n31, and 202nss that extend in the longitudinal direction via the contacts 212a, 212b, 212c, 212d, and 212e respectively from the lines 216a, 216b, 216c, 216d, and 216e formed in the second metal wiring layer, which are also disposed so as to extend in the longitudinal direction. Selection from among the lines 215a, 215b, 215c, 215d, and 215e is made, which are respectively connected to the gate electrodes of the selection transistors STD, the memory elements M0, the memory elements M30, the memory elements M31, and the selection transistors STS of the NAND strings NAND(j, k) (j=0 to 3, k=0 and 1), in accordance with any one signal selected from among the selection signals RD0 to RD3 of the row decoder, which is not illustrated, via the selection transistors Tnsd, Tn0, Tn30, Tn31, and Tnss that are arranged in a matrix form.

Furthermore, according to this embodiment, lines of the same second metal wiring layer in which the bit lines of the NAND strings are formed are used as metal lines for the decoder to thereby simplify the manufacturing process.

In the embodiments, description has been given while assuming that a metal compound is used as a material of the lines 115a, 115b, 115c, 115d, 215a, 215b, 215c, 215d, and 215e that are connected to word lines in order to make the film thickness as thin as possible. However, general metal wiring layers may be used.

In the embodiments, description has been given while assuming the BOX structure. However, the embodiments can be implemented using a usual CMOS structure, and therefore, the structure is not limited to the BOX structure.

In the description of the embodiments, the NMOS silicon pillars are defined as p-type silicon layers, for convenience sake. However, the concentration control in a case of impurity implantation is difficult in a miniaturized process. Therefore, there may be a case where so-called neutral (intrinsic) semiconductors, in which no impurity implantation is involved, are used as silicon pillars for both PMOS transistors and NMOS transistors, and channels are controlled, that is, the thresholds for PMOS and NMOS are controlled by using a difference in the work function specific to the metal gate material.

In the embodiments, the lower diffusion layer or the upper diffusion layer is covered by a silicide layer. Silicide is employed in order to lower the resistance. Other low-resistance materials may be used. As a generic term of a metal compound, silicide is defined to be the material.

The present invention is characterized in that the sources or drains of selection transistors that form memory cells are connected with each other via the lower diffusion layer, and are used as a wiring region, which is a feature of an SGT, to thereby omit a dedicated wiring region and provide a column selection gate decoder having a reduced area. As long as the arrangement method of the present invention is employed, a wiring method and wiring positions relating to the gate lines, a wiring method and wiring positions relating to the metal lines, and the like other than those illustrated in the drawings of the embodiments fall within the technical scope of the present invention.

The invention claimed is:

1. A semiconductor device, comprising:
  a decoder having a plurality of transistors arranged on a substrate, each of the plurality of transistors being formed by disposing a source, a drain, and a gate in layers in a direction perpendicular to the substrate;
  each of the plurality of transistors including:
    a silicon pillar,
    an insulator that surrounds a side surface of the silicon pillar,
    a gate that surrounds the insulator,
    a source region that is disposed on the top or on the bottom of the silicon pillar, and
    a drain region that is disposed on the top or on the bottom of the silicon pillar, the drain region being disposed on an opposite side of the silicon pillar to the source region;
  said decoder including:
    a first selection signal line,
    n second selection signal lines, where n is a natural number,
    n MOS transistors, and
    n output lines, wherein
    the n MOS transistors have gates that are connected to the first selection signal line,
    a k-th MOS transistor, where k=1 to n, has a source region and a drain region, one of the source region and the drain region being connected to any one of the n output lines, and
    another of the source region and the drain region of the k-th MOS transistor is disposed on the bottom of the silicon pillar, and is connected to a k-th selection signal line among the second selection signal lines, via a silicide layer that is disposed closer to the substrate than the silicon pillar.

2. The semiconductor device according to claim 1, wherein:
said decoder is one of a plurality of decoders each including the n MOS transistors; and
the other of the source region and the drain region of each k-th MOS transistor of each set of n MOS transistors that constitutes the plurality of the decoders is connected to a lower diffusion layer via the silicide layer.

3. The semiconductor device according to claim 2, wherein the n output lines are formed as lines of a first wiring layer to an n-th wiring layer, respectively, and are disposed so as to extend in a first direction, and
the lower diffusion layer to which the other of the source region and the drain region of each k-th MOS transistor is connected and the silicide layer that covers the lower diffusion layer are disposed so as to extend in a second direction perpendicular to the first direction.

4. The semiconductor device according to claim 3, wherein the second selection signal lines are lines of a first metal wiring layer, which are disposed so as to extend in the second direction, and
each of the lines of the first metal wiring layer is connected to the silicide layer that covers the lower diffusion layer via a contact.

5. The semiconductor device according to claim 4, wherein the lines of the first metal wiring layer, which extend in the second direction, are disposed below the lines formed in the first wiring layer to the n-th wiring layer, which extend in the first direction.

6. The semiconductor device according to claim 3, wherein the second selection signal lines are lines of a second metal wiring layer, which extend in the second direction,
each of the lines of the second metal wiring layer is connected to the silicide layer that covers the lower diffusion layer via a contact, and
the lines of the second metal wiring layer are disposed above the lines of the first wiring layer to the n-th wiring layer.

7. The semiconductor device according to claim 1, wherein the first wiring layer is made of a metal compound.

8. A semiconductor device, comprising:
a decoder circuit that includes a plurality of transistors arranged on a substrate, each of the plurality of transistors being formed by disposing a source, a drain, and a gate in layers in a direction perpendicular to the substrate,
each of the plurality of transistors including:
a silicon pillar,
an insulator that surrounds a side surface of the silicon pillar,
a gate that surrounds the insulator,
a source region that is disposed on the top or on the bottom of the silicon pillar, and
a drain region that is disposed on the top or on the bottom of the silicon pillar, the drain region being disposed on an opposite side of the silicon pillar to the source region;
the decoder circuit including:
a first selection circuit,
a first selection signal line output from the first selection circuit,
n second selection signal lines, where n is a natural number,
n MOS transistors, and
n output lines, wherein
the n MOS transistors have gates that are connected to the first selection signal line,
a k-th MOS transistor, where k=1 to n, has a source region and a drain region, one of the source region and the drain region being connected to any one of the n output lines,
another of the source region and the drain region of the k-th MOS transistor is disposed on the bottom of the silicon pillar, and is connected to a k-th selection signal line among the second selection signal lines, via a silicide layer that is disposed closer to the substrate than the silicon pillar, and
each of the n output lines is connected to a gate electrode of a corresponding one of n memory elements.

9. The semiconductor device according to claim 8, wherein:
the decoder circuit is one of a plurality of decoder circuits, each of the plurality of the decoder circuits including the n MOS transistors, and
the other of the source region and the drain region of each k-th MOS transistor of each set of n MOS transistors that constitutes the plurality of the decoder circuits is connected to a lower diffusion layer via the silicide layer.

10. The semiconductor device according to claim 9, wherein
the n output lines are formed as lines of a first wiring layer to an n-th wiring layer, respectively, and are disposed so as to extend in a first direction, and
the lower diffusion layer to which the other of the source region and the drain region of each k-th MOS transistor is connected and the silicide layer that covers the lower diffusion layer are disposed so as to extend in a second direction perpendicular to the first direction.

11. The semiconductor device according to claim 10, wherein
the second selection signal lines are lines of a first metal wiring layer, which extend in the second direction, and
each of the lines of the first metal wiring layer is connected to the silicide layer that covers the lower diffusion layer via a contact.

12. The semiconductor device according to claim 11, wherein the lines formed in the first metal wiring layer are disposed in a layer below the lines formed in the first wiring layer to the n-th wiring layer.

13. The semiconductor device according to claim 10, wherein
the second selection signal lines are lines of a second metal wiring layer, which extend in the second direction,
each of the lines of the second metal wiring layer is connected to the silicide layer that covers the lower diffusion layer via a contact, and
the lines of the second metal wiring layer are disposed above the lines of the first wiring layer to the n-th wiring layer.

14. The semiconductor device according to claim 8, wherein the first wiring layer is made of a metal compound.

15. A semiconductor device, comprising:
a decoder that includes a plurality of transistors arranged on a substrate, each of the plurality of transistors being formed by disposing a source, a drain, and a gate in layers in a direction perpendicular to the substrate,
each of the plurality of transistors including
a silicon pillar,
an insulator that surrounds a side surface of the silicon pillar,
a gate that surrounds the insulator, a source region that is disposed on the top or on the bottom of the silicon pillar, and a drain region that is disposed on the top or on the bottom of the silicon pillar, the drain region being disposed on an opposite side of the silicon pillar to the source region, said decoder including:

a first selection circuit, a first selection signal line output from the first selection circuit, n second selection signal lines, where n is a natural number, n MOS transistors, n output lines, and a NAND-connected memory element group that includes n memory elements vertically stacked on the substrate, the n memory elements each including a drain, a source, and a gate electrode, the drain of a memory element being connected to the source of a subsequent memory element, wherein the n MOS transistors are disposed in a column in a first direction, and have gates that are connected to the first selection signal line, a k-th MOS transistor, where k=1 to n, has a source region and a drain region, one of the source region and the drain region being connected to any one of the n output lines that are disposed so as to extend in the first direction, another of the source region and the drain region of the k-th MOS transistor is disposed on the bottom of the silicon pillar, and is connected to a k-th selection signal line among the second selection signal lines that are disposed so as to extend in a second direction perpendicular to the first direction, via a silicide layer that is disposed closer to the substrate than the silicon pillar, and each of the n output lines is connected to the gate electrode of a corresponding one of the n memory elements in the memory element group.

16. The semiconductor device according to claim 15, wherein:

the decoder is one of a plurality of decoders;

the plurality of the decoders are disposed side by side in the second direction, each of the plurality of the decoders further includes a second selection circuit that outputs the n second selection signal lines, where n is a natural number, the other of the source region and the drain region of a corresponding k-th MOS transistor among the plurality of the decoders is connected to a lower diffusion layer disposed on the bottom of the silicon pillar via the silicide layer, and is connected to the k-th selection signal line among the second selection signal lines, and a specified one memory element is selected from the memory element group by the first selection circuit and the second selection circuit.

17. The semiconductor device according to claim 15, wherein the NAND-connected memory element group further includes a source line provided on a substrate side and a bit line provided on a top portion opposite the substrate side, and a first selection transistor, the n memory elements, and a second selection transistor are connected in this order between the bit line and the source line.

18. The semiconductor device according to claim 15, wherein the second selection signal lines are lines of a first metal wiring layer, which are disposed so as to extend in the second direction, and each of the lines of the first metal wiring layer is connected to the silicide layer that covers a lower diffusion layer via a contact, and is disposed below the lines of the first wiring layer to the n-th wiring layer, which are disposed so as to extend in the first direction.

19. The semiconductor device according to claim 15, wherein the second selection signal lines are lines of a second metal wiring layer, which extend in the second direction, and each of the lines of the second metal wiring layer is connected to the silicide layer that covers a lower diffusion layer via a contact, and is disposed above the lines of the first wiring layer to the n-th wiring layer, which are disposed so as to extend in the first direction.

* * * * *